(12) United States Patent
Markowz

(10) Patent No.: US 12,269,740 B2
(45) Date of Patent: Apr. 8, 2025

(54) DEVICE AND PROCESS FOR THE PRODUCTION OF HYDROGEN AND SOLID CARBON FROM C1- TO C4-ALKANE CONTAINING GAS

(71) Applicant: Uniper Kraftwerke GmbH, Dusseldorf (DE)

(72) Inventor: Georg Markowz, Alzenau (DE)

(73) Assignee: Uniper Kraftwerke GmbH, Dusseldorf (DE)

( * ) Notice: Subject to any disclaimer, the term of this patent is extended or adjusted under 35 U.S.C. 154(b) by 769 days.

(21) Appl. No.: 17/600,568

(22) PCT Filed: Apr. 1, 2020

(86) PCT No.: PCT/EP2020/059258
§ 371 (c)(1),
(2) Date: Sep. 30, 2021

(87) PCT Pub. No.: WO2020/201356
PCT Pub. Date: Oct. 8, 2020

(65) Prior Publication Data
US 2022/0212923 A1     Jul. 7, 2022

(30) Foreign Application Priority Data
Apr. 2, 2019   (EP) ..................... 19020245

(51) Int. Cl.
*C01B 3/24*     (2006.01)
*B01D 45/16*     (2006.01)
(Continued)

(52) U.S. Cl.
CPC ............. *C01B 3/24* (2013.01); *B01J 19/0013* (2013.01); *B01J 19/1806* (2013.01); *C01B 3/50* (2013.01);
(Continued)

(58) Field of Classification Search
CPC ........ B01D 45/00; B01D 45/12; B01D 45/16; B01J 19/00; B01J 19/0006; B01J 19/0013;
(Continued)

(56) References Cited

U.S. PATENT DOCUMENTS 3,328,276 A * 6/1967 Schmidt ............... H05H 1/40
422/906
6,395,197 B1    5/2002 Detering et al.
2016/0311683 A1   10/2016 Spitzl

FOREIGN PATENT DOCUMENTS

CN       1552680 A     12/2004
CN    101734620 B     10/2011
(Continued)

OTHER PUBLICATIONS

Canadian Office Action mailed Jan. 5, 2024 in corresponding Canadian Patent Application No. 3,135,308.
(Continued)

*Primary Examiner* — Natasha E Young
(74) *Attorney, Agent, or Firm* — Leydig, Voit & Mayer, Ltd.

(57) ABSTRACT

The present invention concerns a device for the production of hydrogen and solid carbon from $C_1$ to $C_4$-alkane-containing gas by means of thermal plasma, a process for the production of hydrogen and solid carbon from $C_1$ to $C_4$-alkane-containing gas by means of thermal plasma, and the use of a device in a process for the production of hydrogen and solid carbon from $C_1$ to $C_4$-alkane-containing gas by means of a process of the invention.

17 Claims, 2 Drawing Sheets

(51) Int. Cl.
  *B01J 19/00* (2006.01)
  *B01J 19/18* (2006.01)
  *C01B 3/50* (2006.01)
  *C09C 1/48* (2006.01)
  *H05H 1/40* (2006.01)
  *H05H 1/42* (2006.01)
  *H05H 1/48* (2006.01)

(52) U.S. Cl.
  CPC ............... *C09C 1/485* (2013.01); *H05H 1/40* (2013.01); *H05H 1/42* (2013.01); *H05H 1/48* (2013.01); *B01D 45/16* (2013.01); *B01J 2219/00166* (2013.01); *C01B 2203/0861* (2013.01); *C01B 2203/0872* (2013.01); *C01B 2203/1235* (2013.01)

(58) Field of Classification Search
  CPC .... B01J 19/18; B01J 19/1806; B01J 2219/00; B01J 2219/00049; B01J 2219/00051; B01J 2219/00164; B01J 2219/00166; C01B 3/00; C01B 3/02; C01B 3/22; C01B 3/24; C01B 3/50; C01B 2203/00; C01B 2203/08; C01B 2203/0805; C01B 2203/0861; C01B 2203/0872; C01B 2203/12; C01B 2203/1205; C01B 2203/1211; C01B 2203/1235; C01B 2203/1241; H01J 37/00; H01J 37/32; H01J 37/32009; H01J 37/32055; H01J 37/32431; H01J 37/3244; H01J 37/32449; H05H 1/00; H05H 1/24; H05H 1/26; H05H 1/32; H05H 1/34; H05H 1/40; H05H 1/42; H05H 1/48; Y02P 20/00; Y02P 20/10; Y02P 20/133
  See application file for complete search history.

(56) References Cited

FOREIGN PATENT DOCUMENTS

| | | |
|---|---|---|
| JP | 2014-196234 A | 10/2014 |
| RU | 2087413 | 8/1997 |
| RU | 2425795 | 8/2011 |
| RU | 2616040 | 4/2017 |

OTHER PUBLICATIONS

Chinese Office Action mailed Aug. 21, 2023 in corresponding Chinese Patent Application No. 202080035656.0.
Russian Office Action mailed Sep. 14, 2023 in corresponding Russian Patent Application No. 2021131148.
Russian Search Report mailed Sep. 13, 2023 in corresponding Russian Patent Application No. 2021131148.
Japanese Office Action mailed Mar. 7, 2024 in corresponding Japanese Patent Application No. 2021-560450.

* cited by examiner

DEVICE AND PROCESS FOR THE PRODUCTION OF HYDROGEN AND SOLID CARBON FROM C1- TO C4-ALKANE CONTAINING GAS

CROSS-REFERENCE TO RELATED APPLICATIONS

This application is a U.S. National Stage Application filed under 35 U.S.C. § 371 of International Application No. PCT/EP2020/059258, now WO 2020/201356, filed Apr. 1, 2020, which claims the benefit of European Patent Application No. EP 19020245.7, filed Apr. 2, 2019. Both of these applications are hereby incorporated by reference in their entireties.

FIELD OF THE INVENTION

The present invention relates to a device, process, and use of a device in a process for the production of hydrogen and solid carbon from $C_1$- to $C_4$-alkane-containing gas by means of thermal plasma employing at least one reactor for generating thermal plasma by means of an electric arc.

BACKGROUND OF THE INVENTION

There is an increasing demand for the production of clean and storable energy sources which upon production and consumption have a reduced $CO_2$ footprint. However, such energy sources will ultimately penetrate the market only if the costs connected with their production are sufficiently low. This applies especially to energy sources for the sectors of mobility, heat production, and the chemical industry, steel industry, and refinery industry.

For some time now, the use of hydrogen has been investigated, either for direct combustion, use in fuel cells, or for production of synthetic fuels, such as methanol, dimethyl ether, synthetic natural gas, synthetic gasoline, synthetic diesel, or synthetic kerosene, using for example carbon dioxide ($CO_2$) as carbon source. Conventionally, hydrogen is produced from coal, or liquid or gaseous hydrocarbons by means of gasification or reforming reactions. These conversions typically take place at high temperatures and go along with significant emissions of $CO_2$, both from the reactions and the generation of the heat needed to drive these reactions.

For low or reduced $CO_2$ intensity production of hydrogen, several routes have been investigated and are currently being developed. For example, one option is capturing of $CO_2$ from off gases of conventional hydrogen production plants with subsequent compression and sequestration of $CO_2$. Especially in case of hydrogen production sites far away from sequestration sites, costs for logistics may be prohibitively high. Another option, for example, is electrolysis to split water into oxygen and hydrogen. Here, a high amount of energy (current) is needed in the electrolysis process to drive the reaction (water splitting, cf. reaction (1)). The standard molar enthalpy of reaction is given herein for various reactions and is based on 298 K, if not specified otherwise.

$$2H_2O \rightarrow O_2 + 2H_2 \Delta H = +241 \text{ kJ/mol} \qquad (1)$$

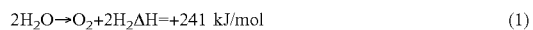

Due to the large specific amount of electrical energy needed in the electrolysis, the overall $CO_2$ emissions are strongly related to the $CO_2$ emissions connected with the production of the consumed electricity. Today, at many places in the world, penetration of renewable power production is not yet sufficient and hence average $CO_2$ emissions from power production are too high to run electrolysis ecologically meaningful on grid mix electricity. On the other hand, if electrolysis was only or predominantly operated on renewable electricity, the corresponding annual full load hours would often still be too low to enable economic operation.

Due to significantly lower binding energy of hydrogen-carbon bonds in hydrocarbons, such as methane, compared to the binding energy of hydrogen-oxygen bonds in water, the specific splitting energy demand is correspondingly lower for said hydrocarbons. Accordingly, the splitting of hydrocarbons into hydrogen and carbon theoretically allows for hydrogen production with less energy input than for the electrolysis process.

Several technologies have been investigated and developed to exploit these advantages. For example, WO2013/004398 A2 (Linde and BASF) describes a process for splitting of hydrocarbons in the presence of carbon-rich granules which form a moving bed. The heat needed to drive the splitting is provided by combustion of a fuel comprising a portion of the hydrogen and hydrocarbons. As a disadvantage, the technology requires quite high specific capital expenditure, especially at smaller scale.

Another plasma-based partial hydrocarbon splitting process, which is however not in the focus when high hydrogen yield and pure carbon production is concerned, is plasma-based acetylene ($C_2H_2$) production starting from $C_1$- to $C_4$-alkanes, e.g., from methane ($CH_4$), or even higher molecular weight hydrocarbons. Acetylene is a highly valuable compound as it may serve as feedstock in some chemical syntheses. During the course of this process, hydrogen is produced as a by-product, yet, some of the hydrogen of the feedstock still remains with the target product acetylene (cf. formula (2), showing the methane conversion as an example of hydrocarbon conversion).

$$2CH_4 \rightleftharpoons C_2H_2 + 3H_2 \Delta H = +376 \text{ kJ/mol} \qquad (2)$$

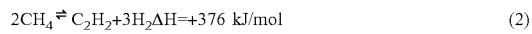

One example of such a process is the commercially implemented "Huels arc process". There, a one-step conversion of low molecular weight hydrocarbons, for example methane, to acetylene by means of an electric arc is followed by extremely rapid cooling of the hydrocarbon-derived plasmaeous plasma gas, the so-called quenching step, optionally in two steps using various fluids, to stabilize the highly reactive acetylene. Thereby, formation of derivatives such as high molecular weight hydrocarbon compounds from acetylene is prevented (cf. Acetylene, Paessler et al., Ullmann's Encyclopedia of Industrial Chemistry, doi: 10.1002/14356007.a01_097.pub4, 2011). In view of extensive hydrogen production, application may be restricted by the need to find sufficient demand for acetylene. This may render commercialization of the process complex and hence restrict its potential for hydrogen production.

One more recent example of an electric arc-based process for partial splitting of hydrocarbons is described in WO2015/140058 A1 (BASF). There, methane-containing gas is converted to acetylene by means of an electric arc. Immediately afterwards, the acetylene-containing mixture is rapidly cooled (quenched) with further methane-containing gas to increase the yield of acetylene. Then, the acetylene is further mixed with another hydrocarbon-containing feedstock and maintained at lower temperatures to facilitate its reaction with the additional feedstock to one or more hydrogen- and carbon-containing products having a boiling point of at least 15° C. The reactor described therein has three to four different sections of defined length. In each section, gaseous or liquid medium is introduced by at least one inlet for the respective medium. Thereby, the process of WO2015/140058 A1 ensures the formation of the one or more hydrogen- and carbon-containing organic compounds having a boiling point of at least 15° C. The present inventor has found that neither the reactor nor the process described therein allows for an energy efficient and cost-effective process for production of hydrogen and solid carbon from $C_1$- to $C_4$-alkane-containing gas with high yields of hydrogen. Furthermore, the process imposes the need to find an application for the chemicals produced in parallel to hydrogen which may render commercialization of the process complex and hence restrict its potential for hydrogen production.

One approach for plasma-based hydrogen and solid carbon production by hydrocarbon splitting is described in document WO93/12030 A1 (Kvaerner). There, a voluminous reactor is equipped with concentrically arranged tubular electrodes inserted into each other. An electric arc is established at the ends of the electrodes facing into the reactor volume and generates a plasmaeous plasma gas from hydrogen which is then mixed with methane in a second step. The process is specially designed to obtain carbon particles of specific properties such as particle size and morphology. The present inventor found that such two-step processes for the hydrogen production require a high reactor volume and in addition results in reactor zones of separate process conditions including temperatures and gas compositions rendering the processes overall inefficient and costly.

An alternative method of plasma-based hydrogen production from hydrocarbon splitting is described in WO01/46067 A1 (Bechtel). Key of this process is the use of a laval-type nozzle in the reactor. Similar to WO2015/140058 A1, methane is converted to acetylene using an electric arc to produce a plasmaeous plasma gas from hydrogen or inert gas. Methane is fed into the plasmaeous plasma gas to produce acetylene. The mixture is then passed downstream through the nozzle. By a specific gas dynamic effect, the nozzle induces a relatively high pressure decrease of the gas leaving the nozzle downstream. Concomitantly, the mean temperature is significantly decreased. It is stressed in WO01/46067 A1 that the described process and reactor parameters, e.g., the position of the supply inlets and the diameter of the reactor chamber, are essential to achieve the desired gas expansion and splitting of all hydrocarbons into the target products hydrogen and carbon. The sensible heat from the hot process gas upstream of the nozzle is thus largely not exploited for achieving high efficiency of the splitting process. Furthermore, a high pressure drop is generally undesired, since most downstream processes or logistics of hydrogen would require correspondingly more recompression. Overall, the process is characterized by a very specific design requiring tuned process conditions and high specific energy expenses which are detrimental in the context of the desire to provide an energy efficient process for the hydrogen and solid carbon production.

So, these processes have limitations in connection with the aim of an economical, clean and environmentally friendly energy efficient hydrogen and solid carbon production. In particular, these processes have high investment and operation costs, and/or low energy efficiency.

SUMMARY OF THE INVENTION

The present invention relates to devices, methods, and use of devices in processes for the production of hydrogen and solid carbon from $C_1$- to $C_4$-alkane-containing gas by means of thermal plasma as defined in the appended claims.

More specifically, in a first aspect the present invention concerns a device for the production of hydrogen and solid carbon from $C_1$- to $C_4$-alkane-containing gas by means of thermal plasma, characterized in that the device comprises
at least one reactor for generating a thermal plasma by means of an electric arc, the reactor comprising
i) a plasma section comprising
an anode and a cathode for generating an electric arc, the arc extending within the plasma section, and
at least one first feed line for introducing a $C_1$- to $C_4$-alkane-containing plasma gas into the plasma section of the reactor,
wherein the anode has a hollow channel along the flow direction of the main stream of the plasma gas which has an inner surface, an outlet in the flow direction of the main stream of the plasma gas which forms the open end of the anode in the flow direction of the main stream, and at least one inlet for receiving the $C_1$- to $C_4$-alkane-containing plasma gas introduced into the plasma section of the reactor via the at least one first feed line wherein the inlet forms the open end of the anode facing into the direction opposite to the flow direction of the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode, and
wherein said anode and said cathode are arranged so that the arc generated by them is formed in said plasma section to form a plasmaeous plasma gas in said plasma section from the $C_1$- to $C_4$-alkane-containing plasma gas introduced into said plasma section through said at least one first feed line, and wherein the foot points of the electric arc contacting the anode are located on the inner surface of the hollow channel of the anode, and
ii) a second reactor section directly downstream of the plasma section of the reactor in the flow direction of the main stream, the second reactor section comprising
a first subsection and a second subsection, wherein the second subsection is directly downstream of the first subsection in the flow direction of the main stream, and
outlet means for withdrawing components from the reactor, wherein the outlet means are located at the end of the second reactor section in the flow direction of the main stream, wherein
the first subsection comprises at least one second feed line for introducing a $C_1$- to $C_4$-alkane-containing gas into the second reactor section, wherein
the at least one second feed line is arranged such that the $C_1$- to $C_4$-alkane-containing gas which is introduced into the reactor via the at least one second feed line is introduced into the plasmaeous plasma gas at a position downstream of the foot points of the electric arc in the flow direction of the main stream, so that in the first subsection of the second reactor section downstream of the at least one second feed line a mixture is formed from the plasmaeous plasma gas leaving the plasma section and the $C_1$- to $C_4$-alkane-containing gas of the at least one second feed line, and wherein the position of the at least one second feed line along the flow direction of the main stream defines the beginning of the second reactor section and of its first subsection, and wherein the volume of the plasma section which begins at the most upstream position at which the inner surface of the hollow channel of the anode is facing the electric arc and reaches down to the end of the plasma section of the reactor has a volume in the range of 0.0001 $m^3$ to 0.4 $m^3$, preferably in the range of 0.001 to 0.2 $m^3$, and defines a reference volume, and wherein the volume of the first subsection of the second reactor section is in the range of 10 to 200 times the reference volume, preferably in the range of 20 to 100 times the reference volume, and wherein the volume of the total second reactor section is in the range of 20 to 2000 times the reference volume, preferably in the range of 40 to 1000 times the reference volume, and wherein the reactor comprises in the first subsection of the second reactor section and/or in the plasma section in the range downstream in the flow direction of the main stream of the foot points of the electric arc on the inner surface of the hollow channel of the anode down to the end of the plasma section at least at one point a flow cross-section transverse to the flow direction of the main stream which is greater by at least a factor of 5, preferably by at least a factor of 10, in comparison with the average flow cross-section of the anode transverse to the flow direction of the main stream in the range of the foot points of the electric arc on the inner surface of the hollow channel of the anode.

In a second aspect, the present invention concerns a process for the production of hydrogen and solid carbon from $C_1$ to $C_4$-alkane-containing gas by means of thermal plasma, characterized in that the process comprises the steps a) withdrawing a $C_1$- to $C_4$-alkane-containing plasma gas from a device for providing a $C_1$- to $C_4$-alkane-containing gas;

b) introducing the $C_1$- to $C_4$-alkane-containing plasma gas withdrawn from the device for withdrawing a $C_1$- to $C_4$-alkane-containing plasma gas into at least a first reactor; wherein said reactor is a reactor for generating a thermal plasma by means of an electric arc, said reactor comprising i) a plasma section comprising
  an anode and a cathode for generating an electric arc, the arc extending within the plasma section, and
  at least one first feed line for introducing a $C_1$- to $C_4$-alkane-containing plasma gas into the plasma section of the reactor,
    wherein the anode has a hollow channel along the flow direction of the main stream of the plasma gas which has an inner surface, an outlet in the flow direction of the main stream of the plasma gas which forms the open end of the anode in the flow direction of the main stream, and at least one inlet for receiving the $C_1$- to $C_4$-alkane-containing plasma gas introduced into the plasma section of the reactor via the at least one first feed line wherein the inlet forms the open end of the anode facing into the direction opposite to the flow direction to the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode, and
    wherein said anode and said cathode are arranged so that the arc generated by them is formed in said plasma section to form a plasmaeous plasma gas in said plasma section from the $C_1$- to $C_4$-alkane-containing plasma gas introduced into said plasma section through said at least one first feed line, and wherein the foot points of the electric arc contacting the anode are located on the inner surface of the hollow channel of the anode, and ii) a second reactor section directly downstream of the plasma section of the reactor in the flow direction of the main stream, the second reactor section comprising
  a first subsection and a second subsection, wherein the second subsection is directly downstream of the first subsection in the flow direction of the main stream, and
  outlet means for withdrawing components from the reactor, wherein the outlet means are located at the end of the second reactor section in the flow direction of the main stream, and
  the first subsection comprises at least one second feed line for introducing a $C_1$- to $C_4$-alkane-containing gas into the second reactor section, wherein the position of the at least one second feed line along the flow direction of the main stream defines the beginning of the second reactor section and of its first subsection, and wherein the $C_1$- to $C_4$-alkane-containing plasma gas is introduced into the reactor via the at least one first feed line for introducing a $C_1$- to $C_4$-alkane-containing plasma gas into the plasma section of the reactor;

c) generating an electric arc with the anode and cathode extending within the plasma section of the reactor;

d) forming a plasmaeous plasma gas in the plasma section of the reactor by means of the electric arc from the $C_1$- to $C_4$-alkane-containing plasma gas introduced into the plasma section via the at least one first feed line for introducing a $C_1$- to $C_4$-alkane-containing plasma gas into the plasma section;

e) introducing a $C_1$- to $C_4$-alkane-containing gas into the first subsection of the second reactor section via the at least one second feed line for introducing a $C_1$- to $C_4$-alkane-containing gas into the second reactor section, wherein the introduction is carried out in such a way that the $C_1$- to $C_4$-alkane-containing gas, which is introduced into the second reactor section via the at least one second feed line, is introduced into the plasmaeous plasma gas in the flow direction of the main stream downstream of the foot points of the electric arc produced by the anode and cathode, so that in the first subsection of the second reactor section downstream of the at least one second feed line a mixture is formed from the plasmaeous plasma gas leaving the plasma section and the $C_1$- to $C_4$-alkane-containing gas which is introduced into the first subsection of the second reactor section via the at least one second feed line, wherein the plasmaeous plasma gas at the position at which the $C_1$- to $C_1$- to $C_4$-alkane-containing gas is introduced into the plasmaeous plasma gas via the at least one second feed line has a mean temperature in the range of 1200 to 3000° C. and comprises acetylene, thereby forming a mixture resulting from the introduction of the $C_1$- to $C_4$-alkane-containing gas via the at least one second feed line into the plasmaeous plasma gas which has in the range from the at least one second feed line down to the end of the first subsection of the second reactor section a mean temperature of at least 850° C., preferably at least 1050° C., and less than 3000° C.;

f) passing the mixture downstream through the second reactor section in the flow direction of the main stream, wherein said passing is such that in the first subsection of the second reactor section the mean residence time of the atoms of the mixture resulting from the plasmaeous plasma gas leaving the plasma section and the $C_1$- to $C_4$-alkane-containing gas of the at least one second feed line is in the range of 100 ms to 2000 ms, preferably in the range of 200 ms to 1000 ms, and the passing is such that in the total second reactor section the mean residence time of the atoms of the mixture resulting from the plasmaeous plasma gas leaving the plasma section and the $C_1$- to $C_4$-alkane-containing gas of the at least one second feed line is in the range of 200 ms to 20000 ms, preferably in the range of 400 ms to 10000 ms, and at least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section, wherein preferably at least 10% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 10% from the mean residence time of all atoms of the mixture resulting from the plasmaeous plasma gas leaving the plasma section and the $C_1$- to $C_4$-alkane-containing gas of the at least one second feed line in the second reactor section, more preferred by at least 15%, even more preferred by at least 20%, from the mean residence time of all atoms of the mixture resulting from the plasmaeous plasma gas leaving the plasma section and the $C_1$- to $C_4$-alkane-containing gas of the at least one second feed line in the second reactor section, and hydrogen and solid carbon are produced by the reactions taking place in the mixture in the second reactor section, and preferably in the plasma section;

g) adjusting the mean temperature of the mixture in the second subsection of the second reactor section to at least 650° C., preferably to at least 750° C., more preferably to at least 850° C. and to less than 1500° C., wherein the mean temperature of the mixture of the plasmaeous plasma gas and the $C_1$- to $C_4$-alkane-containing gas introduced via the at least second feed line at the end of the second reactor section is adjusted to a mean temperature which is at least 200 K, preferably at least 400 K, more preferably at least 600 K, lower than the mean temperature of the plasmaeous plasma gas at the position at which the $C_1$- to $C_4$-alkane-containing gas is introduced into the plasmaeous plasma gas via the at least one second feed line; and h) withdrawing the mixture at the end of the reactor via outlet means for withdrawing the mixture from the reactor, wherein the outlet means are located at the end of the second reactor section in the flow direction of the main stream.

In a third aspect, the present invention concerns the use of a device in a process for the production of hydrogen and solid carbon from $C_1$- to $C_4$-alkane-containing gas by means of thermal plasma according to the present invention, characterized in that the device comprises at least one reactor for generating a thermal plasma by means of an electric arc, the reactor comprising i) a plasma section comprising an anode and a cathode for generating an electric arc, the arc extending within the plasma section, and at least one first feed line for introducing a $C_1$- to $C_4$-alkane-containing plasma gas into the plasma section of the reactor, wherein the anode has a hollow channel along the flow direction of the main stream of the plasma gas which has an inner surface, an outlet in the flow direction of the main stream of the plasma gas which forms the open end of the anode in the flow direction of the main stream, and at least one inlet for receiving the $C_1$- to $C_4$-alkane-containing plasma gas introduced into the plasma section of the reactor via the at least one first feed line wherein the inlet forms the open end of the anode facing into the direction opposite to the flow direction of the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode, and wherein said anode and said cathode are arranged so that the arc generated by them is formed in said plasma section to form a plasmaeous plasma gas in said plasma section from the $C_1$- to $C_4$-alkane-containing plasma gas introduced into said plasma section through said at least one first feed line, and wherein the foot points of the electric arc contacting the anode are located on the inner surface of the hollow channel of the anode, and ii) a second reactor section directly downstream of the plasma section of the reactor in the flow direction of the main stream, the second reactor section comprising a first subsection and a second subsection, wherein the second subsection is directly downstream of the first subsection in the flow direction of the main stream, and outlet means for withdrawing components from the reactor, wherein the outlet means are located at the end of the second reactor section in the flow direction of the main stream, wherein the first subsection comprises at least one second feed line for introducing a $C_1$- to $C_4$-alkane-containing gas into the second reactor section, wherein the at least one second feed line is arranged such that the $C_1$- to $C_4$-alkane-containing gas which is introduced into the reactor via the at least one second feed line is introduced into the plasmaeous plasma gas at a position downstream of the foot points of the electric arc in the flow direction of the main stream, so that in the first subsection of the second reactor section downstream of the at least one second feed line a mixture is formed from the plasmaeous plasma gas leaving the plasma section and the $C_1$- to $C_4$-alkane-containing gas of the at least one second feed line, and wherein the position of the at least one second feed line along the flow direction of the main stream defines the beginning of the second reactor section and of its first subsection, and wherein the volume of the plasma section which begins at the most upstream position at which the inner surface of the hollow channel of the anode is facing the electric arc and reaches down to the end of the plasma section of the reactor has a volume in the range of 0.0001 m³ to 0.4 m³, preferably in the range of 0.001 to 0.2 m³, and defines a reference volume, and wherein the volume of the first subsection of the second reactor section is in the range of 10 to 200 times the reference volume, preferably in the range of 20 to 100 times the reference volume, and wherein the volume of the total second reactor section is in the range of 20 to 2000 times the reference volume, preferably in the range of 40 to 1000 times the reference volume, and wherein the reactor comprises in the first subsection of the second reactor section and/or in the plasma section in the range downstream in the flow direction of the main stream of the foot points of the electric arc on the inner surface of the hollow channel of the anode down to the end of the plasma section at least at one point a flow cross-section transverse to the flow direction of the main stream which is greater by at least a factor of 5, preferably by at least a factor of 10, in comparison with the average flow cross-section of the anode transverse to the flow direction of the main stream in the range of the foot points of the electric arc on the inner surface of the hollow channel of the anode.

DETAILED DESCRIPTION OF THE INVENTION

Figure 1:
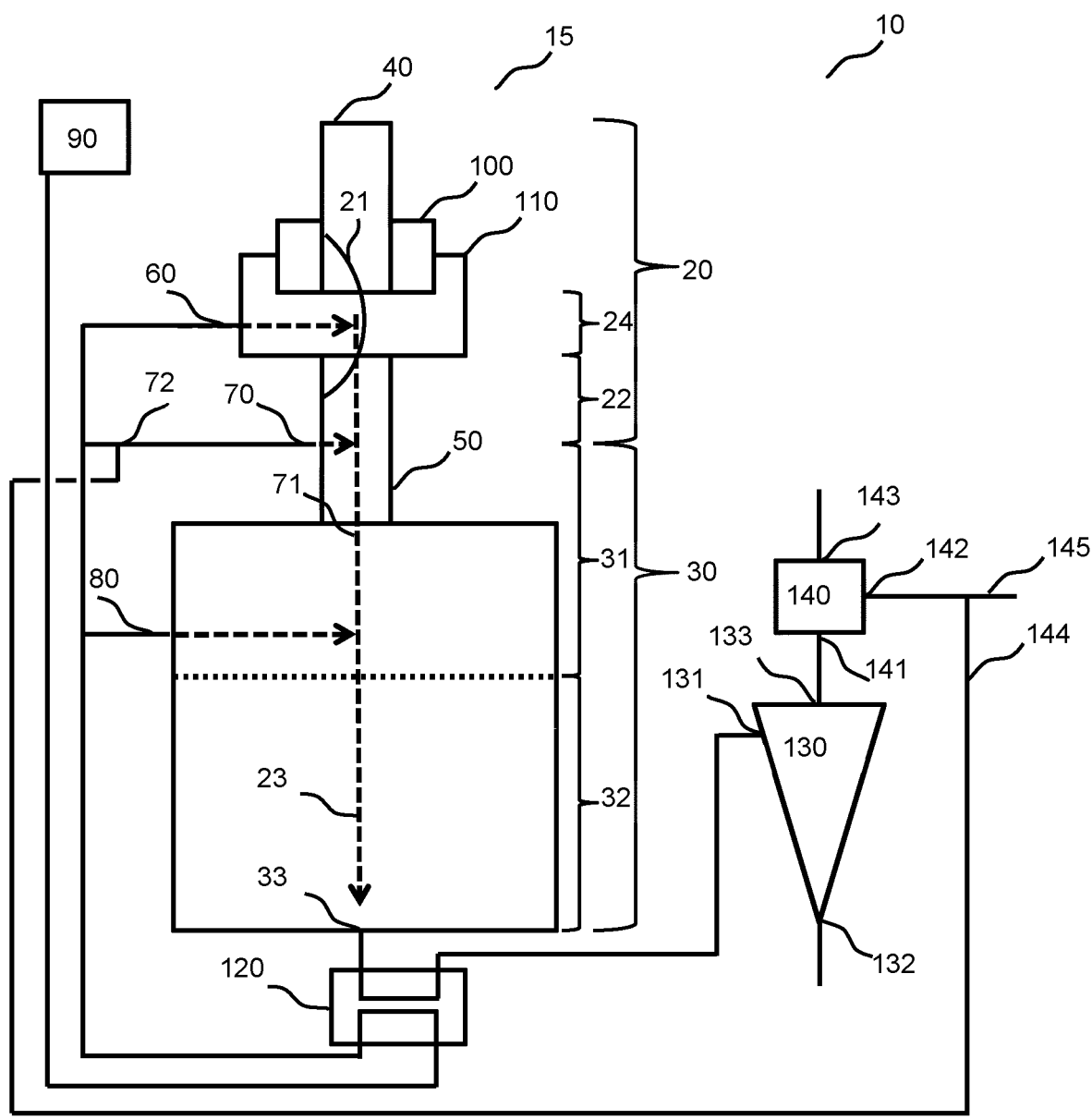
FIG. 1 shows one embodiment of a device (10) for the production of hydrogen and solid carbon from $C_1$- to $C_4$-alkane-containing gas of the present invention which is also suitable for use in a process according to the present invention. The process of the present invention can be put into practice using this device.

In combination with the attached drawings, the detailed description of the invention describes the technical content of the present invention according to preferred embodiments which is not intended to limit the scope of the invention. Any equivalent change and modification made in accordance with the appended claims is covered by the scope of the claims of the present invention.

As outlined above, the present invention concerns three aspects, namely devices, processes, and the use of devices for the hydrogen and solid carbon production. The disclosure contained in the application regarding these three aspects is interchangeably applicable and disclosed herewith.

It was surprisingly realized that using the devices and processes of the prior art, either a significant portion of the hydrocarbons undergo uncontrolled formation of acetylene or other highly unsaturated compounds, or the process parameters needed to run the corresponding processes result in inefficient operation either due to low space time yield or a high pressure drop, or the yield of molecular hydrogen is reduced due to formation of hydrogen-containing higher molecular weight components such as higher molecular weight hydrocarbons.

Acetylene may react to benzene ($C_6H_6$) and higher aromatic compounds. These compounds may result in tar formation which may deposit on the reactor walls or the walls of subsequent equipment (e.g., heat exchangers). It was found that the apparatuses for hydrogen production of the prior art do not sufficiently control the conversion of acetylene to carbon and hydrogen, e.g., by controlling concentrations, residence times, and temperatures along the pathway through the reactor. This results in formation of corresponding hydrogen-containing side products and in deposits of higher molecular compounds and inevitably interruption of process operation to clean the equipment. The present invention avoids this, reduces the amount of hydrocarbon side products in the resulting mixture and eases the continuous production of hydrogen and solid carbon.

In other words, the inventor of the present invention surprisingly found that specific modifications to the prior art devices, especially thermal plasma reactors wherein the thermal plasma is generated by an electric arc, and modifications to the prior art processes allow the production of hydrogen from $C_1$- to $C_4$-alkane-containing gas more efficiently, especially at lower specific energy expenses, and lower capital expenditure for a targeted yield. In particular, the control of concentrations, mean residence times, residence time distribution, and the course of mean temperature ranges along the flow path of the main stream through the reactor allow reducing the generation of undesired by-products and increasing the conversion of feedstock at high space time yield. This is partly because the acetylene produced in the plasmaeous plasma gas is diluted by the $C_1$- to $C_4$-alkane-containing gas introduced into the plasmaeous plasma gas in the first subsection of the second reactor section. The same applies to the device of the invention which ensures the appropriate mixing of the feedstocks, defined mean residence times and residence time distribution of the atoms of the reaction components. The inventor found that the specific modifications to the prior art devices and processes for the production of acetylene allow the efficient production of hydrogen and solid carbon, especially carbon black. So, the invention allows the implementation of a commercially attractive hydrogen and solid carbon production process. This solves the longstanding demand for energy efficient, economical, and environmentally friendly hydrogen production without the above-described drawbacks and limitations. Also, carbon black, the by-product, is used in many industries, e.g., printing industry, and can thus be commercialized as well. Furthermore, undesired by-products in the resulting product gas mixture are largely omitted.

A component according to the present invention may be in gaseous, liquid, or solid state at 273.15 K and 1.01325 bar, if not specified otherwise herein. A component may be an atom, a molecule, an oligomer, a polymer, a radical, or an ion. Radicals and ions are specific species of the corresponding atoms.

The device of the present invention comprises at least one reactor. Accordingly, the device may contain only one reactor. Alternatively, the device of the present invention may comprise two or more reactors. These may be operated in parallel. Running two or more reactors in parallel is advantageous as it provides an increased flexibility. For example, if one reactor is subject of maintenance the other reactor(s) can continue operation. So, it prevents downtime of the whole plant. Also, two or more reactors installed in parallel increase the range of loads at which a single plant can be operated. This may for example be beneficial if grid services such as control power shall be provided by operating the plant at flexible loads.

The term at least one as used herein means 1, 2, 3, 4, 5, and more. In certain embodiments, at least one means one. In further embodiments, at least one means 2 or more.

The terms "in the range of" or "in the range from" refer to ranges. According to the present invention, the endpoints of the specified ranges are considered as part of the ranges if not specified otherwise.

Figure 2:
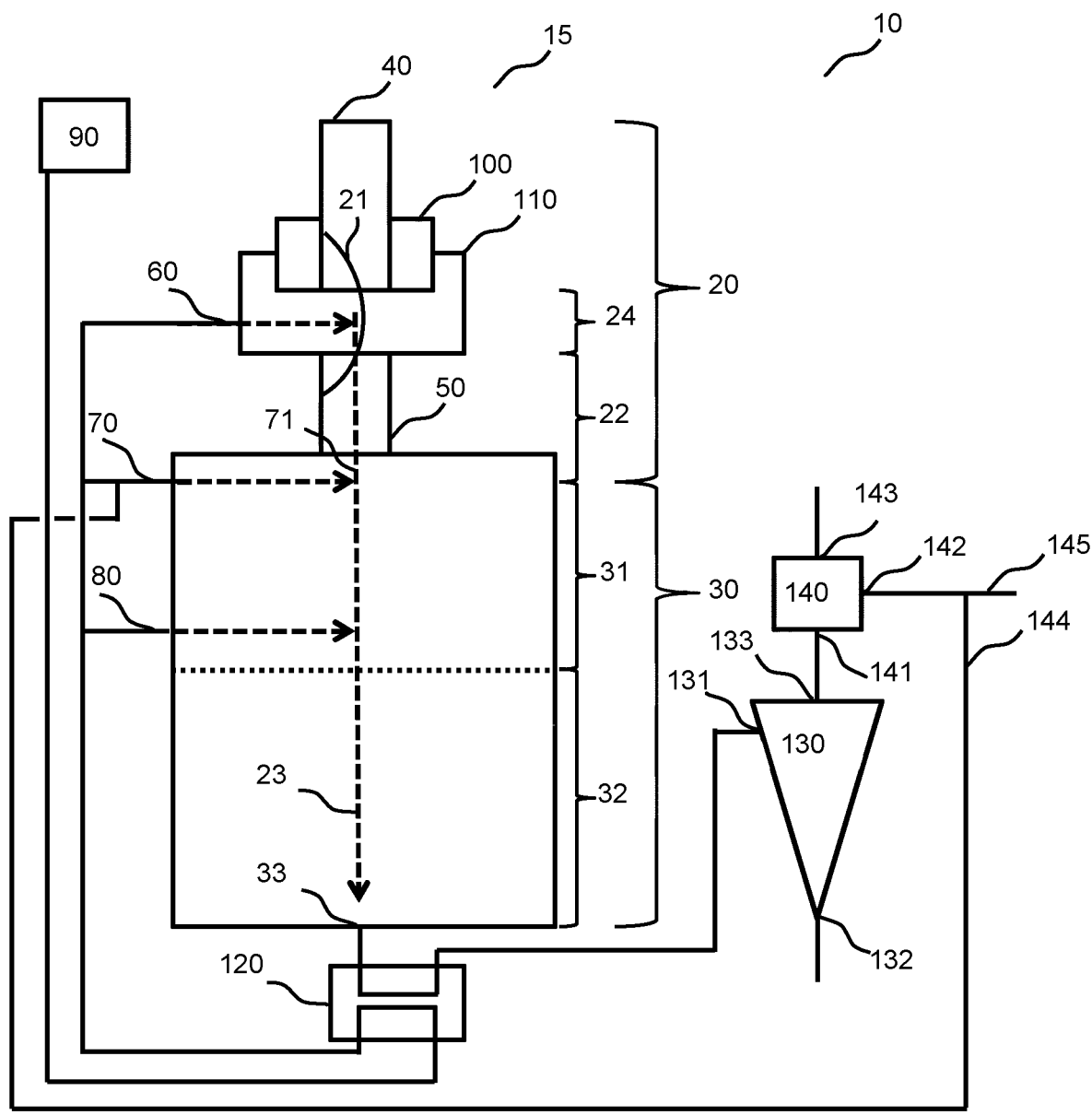
FIG. 2 shows another embodiment of a device (10) for the production of hydrogen and solid carbon from $C_1$- to $C_4$-alkane-containing gas of the present invention which is also suitable for use in a process according to the present invention. The process of the present invention can be put into practice using this device. Here, the most upstream point at which the flow cross-section transverse to the flow direction of the main stream which is greater by at least a factor of 5 in comparison with the average flow cross-section of the anode transverse to the flow direction of the main stream in the range of the foot points of the electric arc on the inner surface of the hollow channel of the anode (71) is upstream in the flow direction of the main stream of the first subsection of the second reactor section.

Even though the FIGS. 1 and 2 illustrate reactors with vertical orientation, also encompassed are reactors with horizontal or any other orientation.

The term reactor as used in the present invention refers to a chemical reactor. The reactor is a closed vessel comprising a reactor space in which chemical reactions takes place. Via inlets and outlets substances may be introduced into the reactor space or withdrawn therefrom, respectively. Here, the reactor is a closed vessel suitable for carrying out the process for the production of hydrogen and solid carbon according to the present invention based on a thermal plasma process, wherein the thermal plasma is generated by an electric arc. One general example of a reactor is the so-called Huels reactor (cf. Acetylene, Paessler et al., Ullmann's Encyclopedia of Industrial Chemistry, doi:10.1002/14356007.a01_097.pub4, 2011). This reactor is used for the production of acetylene. The device of the present invention comprises an electric arc reactor having specific features differing from the Huels reactor which are advantageous to put the claimed process into practice. The claimed device comprising the electric arc reactor can be used to carry-out the claimed process.

The term plasmaeous plasma gas as used in the present invention refers to a gas which is present in a plasma state. A gas which is merely intended to be introduced and/or treated in a reactor for generating a thermal plasma by means of an electric arc, but which is not or not yet present in a plasma state does not fall under the definition of a plasmaeous plasma gas. A gas which exits a reactor for generating a thermal plasma by means of an electric arc and is not or no longer present in a plasma state does, likewise, not fall under the definition of a plasmaeous plasma gas.

According to A. Fridman (Plasma Chemistry, Cambridge University Press, 2009), a gas which is present in a plasma state is generally defined as an ionized gas, i.e. a gas containing at least one electron which is not bound to an atom or molecule, converting the atoms or molecules into positively charged ions. Preferably, a gas which is present in a plasma state contains electrically charged particles in an amount which is sufficient to affect and change its electrical properties and behavior relative to the normal gas state. An example of an electrical property is the electrical conductivity. The electrical conductivity is increased in the plasma state of a gas, especially in the plasma state which is adopted at elevated temperatures. Conceptually, the correlation of the electrical conductivity with the plasma state and the temperature of a gas may be explained as follows: It is known that the degree of ionization increases with temperature (for example shown by tabulated data for hydrogen, nitrogen, oxygen, air and selected noble gases in M. I. Boulos, Thermal Plasmas, Fundamentals and Applications, Vol. 1, 1994). Due to the enhanced mobility of opposite charges, an increased degree of ionization then also comes along with an increased electrical conductivity.

Moreover, a plasmaeous plasma gas in the sense of the current invention is preferably characterized by the fact that the electrical conductivity of the respective plasmaeous plasma gas at a given density is at least 1 order of magnitude, preferably 2 orders of magnitude, even more preferably 4 orders of magnitude higher than the electrical conductivity of the corresponding gas at room temperature and the same density.

Whereas non-plasma state gases at room temperature (i.e. without external electrical or other excitation) have electrical conductivities below $10^{-22}$ S/m, a gas in a plasmaeous state according to the present invention is characterized by an electrical conductivity of at least $10^{-21}$ S/m, preferably at least $10^{-20}$ S/m, even more preferably at least $10^{-18}$ S/m.

In this context, the skilled person can measure the electrical conductivity of a gas by a technique which is analogous to the flame ionization detection method.

A gas which is present in a plasma state is preferably generated by the use of electrical energy, for example by subjecting a gas to a strong electromagnetic field, for example an electromagnetic field which is generated in the surrounding of an electric arc.

A plasmaeous plasma gas, i.e. a gas present in a plasma state, can at least be encountered at one point of a flow cross-section transverse to the flow direction of the main stream in the current reactor.

$C_1$- to $C_4$-alkane-containing gas means a gas which comprises methane, ethane, propane, butane, 2-methyl-propane, or mixtures thereof. The sum of the $C_1$- to $C_4$-alkane(s) in the gas is at least 10 vol. %, preferably at least 25 vol. %, more preferably at least 50 vol. %, more preferred at least 75 vol. %, even more preferred at least 90 vol. %. In some embodiments, the $C_1$- to $C_4$-alkane-containing gas is natural gas. In certain embodiments, the $C_1$- to $C_4$-alkane-containing gas contains methane and/or propane. This is advantageous as both gases can be obtained in large quantities, e.g., methane from natural gas and propane from the production of hydrogenated vegetable oils. Most preferably, the $C_1$- to $C_4$-alkane-containing gas is natural gas or a methane-containing gas. This means that either natural gas may be used as a gas comprising methane or another gas comprising methane. Most preferably, the $C_1$- to $C_4$-alkane-containing gas contains methane, in particular at least 25 vol. % methane, more preferably at least 50 vol. % methane, even more preferably at least 75 vol. % methane, most preferably at least 90 vol. % methane. This applies also to the $C_1$- to $C_4$-alkane-containing plasma gas and to the process and use of a reactor of the present invention. In some embodiments, the $C_1$- to $C_4$-alkane-containing gas which is introduced into the plasma section via the at least one first feed line and the $C_1$- to $C_4$-alkane-containing gas which is introduced into the first subsection of the second reactor section via the at least one second feed line are taken from the same device for $C_1$-$C_1$- to $C_4$-alkane-containing gas supply. Preferably, both are taken from the same device for natural gas supply. So, the device of the present invention may include $C_1$- to $C_4$-alkane-containing gas supplies which are connected with the at least one first and the at least one second feed line. Preferably, both feed lines are connected with the same device for $C_1$- to $C_4$-alkane-containing gas supply. Even more preferably, this device for gas supply comprises natural gas. Nevertheless, the gas withdrawn from the device for gas supply may be further mixed with further components, for example hydrocarbons, prior to its introduction into the reactor, e.g., an acetylene-containing gas, or a hydrogen-containing gas. In the context of the device of the present invention, this means that the at least one first and/or at least one second feed line may be connected with further feed lines to introduce additional components into the gas withdrawn from the device for gas supply.

The term at least one first feed line means 1, 2, 3, 4, 5, or more first feed lines. In some embodiments, at least one first feed line is one first feed line. In further embodiments, at least one first feed line means 2 or more first feed lines.

The term at least one second feed line means 1, 2, 3, 4, 5, or more second feed lines. In some embodiments, at least one second feed line is one second feed line. In further embodiments, at least one second feed line means 2 or more second feed lines.

The term at least one third feed line means 1, 2, 3, 4, 5, or more third feed lines. In some embodiments, at least one third feed line is one second feed line. In further embodiments, at least one third feed line means 2 or more third feed lines.

In addition to the at least one third feed line, the device, process, and use of the invention may include a reactor having at least one fourth feedline downstream of the at least one third feed line in the flow direction of the main stream.

The $C_1$- to $C_4$-alkane-containing gas may also include higher boiling components, e.g., $C_5$-alkanes, olefins, aromatic components, such as benzene, and mixtures thereof, or even mixtures with components containing low amounts of oxygen, e.g., long chain aldehydes like $C_{12}H_{24}O$. In one example, the $C_1$- to $C_4$-alkane-containing gas may include higher boiling components in the range of 0.1 to 50 vol. %, preferably in the range of 0.5 to 30 vol. %, even more preferred in the range of 1 to 10 vol. %. Depending on the feedstocks selected, design parameters and operational parameters may have to be adjusted.

In certain embodiments, the $C_1$- to $C_4$-alkane-containing gas comprises less than 5 vol. % $O_2$, preferably less than 2 vol. % $O_2$, most preferably less than 1 vol. % $O_2$, less than 10 vol. % CO, preferably less than 5 vol. % CO, most preferably less than 2.5 vol. % CO, less than 10 vol. % $CO_2$, preferably less than 5 vol. % $CO_2$, most preferably less than 2.5 vol. % $CO_2$, and/or less than 10 vol. % $N_2$, preferably less than 5 vol. % $N_2$, most preferably less than 1 vol. % $N_2$. This and the above-mentioned definitions of the $C_1$- to $C_4$-alkane-containing gas apply to both the plasma gas and the gas introduced into the reactor via the at least one second feed line. These embodiments apply also to the process and use of a device of the present invention.

Most devices and processes of the prior art involved the use of hydrogen, nitrogen or a noble gas, e.g., helium (He), neon (Ne), argon (Ar), krypton (Kr), or xenon (Xe), or mixtures of hydrogen, nitrogen and/or noble gases as plasma gas or as the main components of the plasma gas. However, the inventor of the present invention found that when using (mainly) hydrogen ($H_2$), nitrogen, or noble gases as plasma gas, the specific energy demand is much higher than in the present invention. Furthermore, it requires significant efforts to separate the produced hydrogen from the raw product gas.

Nevertheless, in certain embodiments of the present invention the $C_1$- to $C_4$-alkane-containing gas comprises from 0.1 up to 25 vol. %, preferably from 0.5 up to 15 vol. %, more preferably from 1 up to 5 vol. %, $H_2$. In particular, the $C_1$- to $C_4$-alkane-containing plasma gas introduced into the plasma section via the at least first feed line may comprise from 0.1 up to 25 vol. %, preferably from 0.5 up to 15 vol. %, more preferably from 1 up to 5 vol. %, $H_2$. The $C_1$- to $C_4$-alkane-containing gas introduced into the first subsection of the second reactor section via the at least one second feed may comprise from 0.1 up to 25 vol. %, preferably from 0.5 up to 15 vol. %, more preferably from 1 up to 5 vol. %, $H_2$. The to $C_4$-alkane-containing gas introduced into the first subsection of the second reactor section via the at least one second feed may comprise from 0.1 up to 10 vol. %, preferably from 0.5 up to 7 vol. %, more preferably from 1 up to 5 vol. %, acetylene.

The following main target (cf. reaction (2), reproduced hereinafter again) and side reactions (cf. reaction (3)) occur in the plasma section using $C_1$- to $C_4$-alkane comprising plasma gas:

Target Reaction:

$$2CH_4 \rightleftarrows C_2H_2 + 3H_2, \Delta H = +376 \text{ kJ/mol} \quad (2)$$

Main Side Reaction (Endothermic):

$$2CH_4 \rightleftarrows C_2 + 2H_2, \Delta H = +75 \text{ kJ/mol} \quad (3)$$

As indicated by the positive enthalpy difference, a significant amount of energy is required to drive the hydrogen production. The inventor surprisingly found that claimed device, process, and use are advantageous because they induce the exothermic acetylene decomposition reaction (4) in the second reactor section in a controlled manner thereby reducing formation of undesired high molecular weight hydrocarbons such as tars. At the same time, this reaction enables addition and splitting of further $C_1$- to $C_4$-alkane-containing feedstock, thus increasing absolute hydrogen and solid carbon yield and lowering the overall specific electric energy expenses. The energy needed to split more $C_1$- to $C_4$-alkane-containing gas into hydrogen and carbon black can be provided by the decomposition of acetylene. It is thus possible to increase the capacity of a plasma reactor and to reduce the total specific electricity demand for $C_1$- to $C_4$-alkane-containing gas splitting.

Main Exothermic Reaction:

$$C_2H_2 \rightarrow 2C_s + H_2, \Delta H = -226 \text{ kJ/mol} \quad (4)$$

Usually, the pathways of acetylene successive reactions are complex. For example, it has been known that acetylene undergoes combination to form benzene and from that to form higher aromatics and tars. The latter may result in undesired deposition on reactor walls and necessities to interrupt process operation as to clean the reactor. The addition of further $C_1$- to $C_4$-alkane-containing gas in the reaction pathway and under the boundary conditions disclosed in the present invention leads first to a controlled reduction of the mean temperature of the plasmaeous plasma gas resulting in a reduced reactivity and second in a dilution of acetylene. Both are intended to suppress an undesired formation of above-mentioned tars and prevent undesired successive reactions of acetylene. The inventor found that the heat of acetylene decomposition can be used for splitting of further $C_1$- to $C_4$-alkanes containing feedstock into hydrogen and carbon black. Therefore, the reactor, the use, and the process are designed such to reduce oligomerization of acetylene and rather destabilize acetylene as much as possible in the second reactor section while ensuring that its degradation drives the conversion of the injected $C_1$- to $C_4$-alkanes to hydrogen and carbon black. It was surprisingly found that this is for example not only ensured by the claimed mean residence time and the mean temperature profiles, but also by the residence time distribution. This is also established by the special device design. The mean residence time and the residence time distribution as defined herein refer to the atoms of the mixture. Hence, they refer only to the atoms of the plasmaeous plasma gas and the $C_1$- to $C_4$-alkane-containing gas injected via the at least one second feed line.

For material flowing through a volume, the residence time of a single atom is a measure of how much time the atom spends in it. A single atom including an atom contained in molecules, oligomers, polymers, or particles has a single residence time, but mixtures of a multitude of atoms including atoms contained in molecules or particles have a residence time distribution (RTD), because the individual flow paths and velocities in general may vary. Therefore, the present invention refers to the mean residence time to define the average residence time of all atoms of the mixture passing the second reactor section. The mean residence time and the residence time distribution may be measured for example by introducing a non-reactive tracer into the reactor at the inlet.

Importantly, the inventor surprisingly found that it is advantageous to avoid the acetylene stabilization which is key to the prior art processes. In other words, the inventor found that it is advantageous to omit the extensive quenching of the mixture in the reactor as this is intended to stabilize acetylene. Therefore, the device, the process, and the use of the present invention refrain from taking this measure.

Thus, the energy needed to split more $C_1$- to $C_4$-alkane-containing gas into hydrogen and solid carbon, e.g., carbon black, is partially provided by the decomposition of acetylene due to the specific features of the claimed device, process, and use. It is thus possible to increase the capacity of a plasma reactor and to reduce the total specific electricity demand for splitting $C_1$- to $C_4$-alkane-containing gas.

The device of the present invention may be an industrial plant, decentral small-scale plant, laboratory scale equipment, or a pilot plant for the hydrogen and solid carbon production. The device may comprise one or several reactors for generating thermal plasma by means of an electric arc. Accordingly, the device may comprise several reactors running in parallel or alternately.

The term mean temperature as used herein refers to the average temperature across the area transverse to the flow direction of the main stream, wherein the local temperatures are weighted by the corresponding mass flow and mean heat capacities.

It is to be understood that the conditions and process parameters defined and mentioned herein refer to steady state operation of the reactor, unless explicitly specified otherwise.

The term mixture as used herein refers to the mixture of components resulting from the mixture of the plasmaeous plasma gas leaving the plasma section and the $C_1$- to $C_4$-alkane-containing gas which is introduced into the plasmaeous plasma gas in the first subsection of the second reactor section via at least one second feed line. The composition of the mixture may vary due to reactions of its components along their passage through the second reactor section and any subsequent devices. The components of the mixture may be in gaseous, liquid and/or solid state.

The reactor comprises a plasma section and a second reactor section directly downstream of the plasma section of the reactor in the flow direction of the main stream. The plasma section is part of the reactor. The $C_1$- to $C_4$-alkane-containing plasma gas is introduced into the plasma section via the at least one first feed line. The plasma section further comprises an anode and a cathode which generate an electric arc extending within the plasma section. The electric arc heats the plasma gas to form a plasmaeous plasma gas in said plasma section from the $C_1$- to $C_4$-alkane-containing plasma gas introduced into said plasma section through said at least one first feed line. This causes reactions of the components of the plasma gas including, due to the high temperatures, formation of ions and radicals. The plasmaeous plasma gas is thus rich of ionized particles and/or radicals derived from the $C_1$- to $C_4$-alkane-containing plasma gas.

The anode has a hollow channel along the flow direction of the main stream of the plasma gas, which has an inner surface, an outlet in the flow direction of the main stream of the plasma gas, which forms the open end of the anode in the flow direction of the main stream, and at least one inlet for receiving the $C_1$- to $C_4$-alkane-containing plasma gas introduced into the plasma section of the reactor via the first feed line wherein the inlet forms the open end of the anode facing into the direction opposite to the flow direction of the main stream. The anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode. The foot points of the electric arc contacting the anode are located on the inner surface of the hollow channel of the anode. Preferably, the anode has a cylindrical shape having a coaxial hollow channel.

In some embodiments, the corresponding anode and cathode do not at least partially overlap in the flow direction of the main stream. Thus, the anode and cathode are not nested. This is exemplified by FIGS. 1 and 2.

The expression that "anode and cathode do not at least partially overlap" as used in the present invention means that in the main direction of the flow, anode and cathode are spaced apart from each other.

In preferred embodiments, the anode and/or cathode are cooled electrodes, wherein the cooling is preferably liquid cooling, more preferably water cooling. This ensures reduced erosion and long-lasting operation of the electrodes. In further embodiments, the anode and/or the cathode are made of materials comprising less than 10 wt. % of graphite or other solid carbon materials. Reactors comprising graphite- or solid carbon-based electrodes typically exhibit higher deterioration rates and are typically costlier than metal-based electrodes. Accordingly, in preferred embodiments the anode and the cathode of the reactor are metal electrodes.

In further embodiments, the anode and cathode are concentric and also the cathode has a hollow channel with the main axis extending along the flow direction of the main stream, wherein the hollow channel has two opposing ends, wherein the end facing into the direction opposite to the flow direction of the main stream is closed and wherein the end facing into the flow direction of the main stream of the plasma gas is open. Preferably, this open end facing into the flow direction of the main stream of the plasma gas is positioned upstream and concentric to the open end of the anode facing into the direction opposite to the flow direction of the main stream. The term "closed" in the context of the end of the hollow channel of the cathode facing into the direction opposite to the flow direction of the main stream means that the end of the channel is completely closed or that the flow cross-section transverse to the flow direction of the main stream is reduced by at least 90% based on the area of the flow cross-section in comparison with the average flow cross-section of the cathode transverse to the flow direction of the main stream in the range of the foot points of the electric arc on the inner surface of the hollow channel of the cathode.

In these embodiments, the anode and cathode are arranged such that the foot points of the electric arc contact the inner surface of the cathode and the inner surface of the anode, respectively. In preferred embodiments, the anode and the cathode are arranged such that there is a gap in the direction of the main stream between the end of the cathode facing into the flow direction of the main stream and the end of the anode facing into the direction opposite to the flow direction of the main stream. The length of said gap is preferably at least 0.3, more preferably at least 0.5, times the average inner diameter of the hollow channel of the anode in the range of the foot points of the electric arc on the inner surface of the hollow channel of the anode. In some embodiments, the at least one first feed line is arranged such that the plasma gas is introduced into the plasma section of the reactor via the gap between the anode and cathode.

Shape and location of foot points of electric arcs on the cathode and/or on the anode typically vary over time during operation, not only during ramp-up, shut down and load changes, but also during steady state operation. Especially, in case of anodes having a hollow channel and wherein the foot points of the electric arc are on the inner surface of the hollow channel of the anode, the location of the foot points may vary over time and even in steady state operation both along the perimeter of the anode but also at least to a finite extent upwards and downwards in the flow direction of the main stream. The range of the locations of foot points on the inner surface of the hollow channel of the anode in the flow direction of the main stream typically depends on the current mode of operation. For example, if all other process parameters are kept constant, an increase in electrical load results in an elongation of the electric arc and hence in a shift of the range of locations of foot points on the inner surface of the hollow channel of the anode to an area on the surface of the hollow channel of the anode more downstream in the flow direction of the main stream. In the context of the present invention, with respect to the inner surface of the hollow channel of the anode, the term foot points refers to the location of the foot points which is most downstream under all continuous reactor operation modes. The most extended reach of foot points can for example be identified upon revision of an anode after operation based on an analysis of the material erosion on the inner surface of the hollow channel of the anode. The material erosion is namely higher at the part of the inner surface which is contacted by the foot points compared to surface sections which the arc has not reached during operation. The foot points define an area in which the electric arc contacts the anode. Likewise, the area where foot points are located on the inner surface of a hollow channel of a cathode during operation may be identified upon revision after operation.

Typically, for a process as disclosed in this invention, the electric energy input in the plasma section by the electric arc is in the range of 0.5 to 10 $kWh_{el}$ per normal cubic meter (1 $m_N^3$) of $C_1$- to $C_4$-alkane-containing feed plasma gas. A normal cubic meter for the purpose of the present invention is the amount of gas at 1.01325 bar and 273.15 K contained in a volume of 1 cubic meter (1 $m^3$) (DIN 1343, version 1990-01).

The device and thus the reactor may be operated at variable load, e.g., in the range of 50 to 100% of the design load. The load may be controlled depending on specific signals received by a control unit. The signals received by the control unit and used to control the device and the process of the present invention may be signals derived from factors which influence a decision on the process load. These factors may be the price of electricity, the current carbon footprint of the consumed electricity, and/or the request for providing grid services, such as control power.

The term anode, as used for the purpose of the definition of the present invention, is understood narrowly. The anode stretches down to the beginning of the second reactor section which is identical to the beginning of the first subsection of the second reactor section, i.e., the position of the at least one second feed line along the flow direction of the main stream, even though parts beyond the beginning of the first subsection of the second reactor section may have the same electrical potential as the anode. Other parts of the plasma section, e.g., a magnetic device or a device for fluid-dynamically inducing swirling of the plasma gas, do not belong to the anode as defined according to the present invention, even though they may have the same electric potential as the anode. Accordingly, in some embodiments the flow cross-section transverse to the flow direction of the main stream of the reactor at the open end of the anode facing into the flow direction of the main stream, or at the position at which the foot points of the electric arc contact the inner surface of the hollow channel of the anode does not change along the length of the anode and/or the transition from the anode to the second reactor section. In other words, the flow cross-section transverse to the flow direction of the main stream may essentially stay the same in the anode and at the transition from the anode to the second reactor section. Hence, in certain embodiments the flow cross-section at the open end of the anode opposite to the flow direction of the main stream transverse to the flow direction of the main stream may essentially be the same as the flow cross-section transverse to the flow direction of the main stream at the beginning of the first subsection of the second reactor section.

The fact that the reactor comprises a second reactor section (30) directly following the plasma section (20) of the reactor means that the two reactor sections are directly attached to each other. The second reactor section has a first subsection (31) and a second subsection (32), wherein the second subsection directly follows the first subsection in the flow direction of the main stream. At the end of the second reactor section in the flow direction of the main stream outlet means (33) for withdrawing the mixture from the reactor are comprised. These may be one or more lines or valves for withdrawing the mixture from the reactor.

The positioning of the outlet means at the end of the second reactor section means that the outlet means are positioned at or near the end of the second reactor section, as long as it is suitable to withdraw the mixture from the reactor.

The term flow direction of the main stream of a gas (23) or more specifically the flow direction of the main stream of the plasma gas as used herein refers to the overall stream of the gas or the plasma gas, respectively, through the reactor from its injection into the plasma section of reactor until its withdrawal via the outlet means (33) at the end of the second reactor section. Typically, the flow direction of the main stream of the plasma gas refers to the gas which streams through the plasma section. If the second reactor section and the mixture is concerned, it is usually referred to the flow direction of the main stream of the mixture. During the course of the process, the plasma gas reacts and is mixed with further components. Even though the flow direction of the main stream of a gas may change along the pathway of the main stream through the reactor, said flow direction of the main stream is nevertheless a means to define the position and orientation of the features of the process, device, and use of the present invention, as exemplified by the figures. One example are the flow cross-sections which are transverse to the flow direction of the main stream.

The first subsection (31) comprises at least one second feed line (70) for introducing a $C_1$- to $C_4$-alkane-containing gas into the first subsection (31) of the second reactor section (30). It is key to the invention that both, the plasma gas introduced via the at least one first feed line and the gas introduced into the reactor via the at least one second feed line, are $C_1$- to $C_4$-alkane-containing gases. The $C_1$- to $C_4$-alkane-containing gas introduced via the at least one second feed line is introduced into the plasmaeous plasma gas at a position downstream of the foot points of the electric arc on the inner surface of the hollow channel of the anode in the flow direction of the main stream, so that in the first subsection of the second reactor section downstream of the at least one second feed line a mixture is formed comprising the plasmaeous plasma gas leaving the plasma section and the $C_1$- to $C_4$-alkane-containing gas introduced via the at least one second feed line.

The reactor comprises in the first subsection of the second reactor section and/or in the plasma section in the range downstream in the flow direction of the main stream of the foot points of the electric arc on the inner surface of the hollow channel of the anode down to the end of the plasma section, at least at one point a flow cross-section transverse to the flow direction of the main stream which is greater by at least a factor of 5, preferably by at least a factor of 10, in comparison with the average flow cross-section of the anode transverse to the flow direction of the main stream in the range of the foot points of the electric arc on the inner surface of the hollow channel of the anode. The at least at one point at which the flow cross-section transverse to the flow direction of the main stream which is greater by at least a factor of 5, preferably by at least a factor of 10, in comparison with the average flow cross-section of the anode transverse to the flow direction of the main stream in the range of the foot points of the electric arc on the inner surface of the hollow channel of the anode is thus upstream or downstream in the flow direction of the main stream of the at least one second feed line. In certain embodiments, the most upstream point in the flow direction of the main stream at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode is located in the plasma section downstream in the flow direction of the main stream of the foot points of the electric arc on the inner surface of the hollow channel of the anode, whereas in other embodiments it is located in the first subsection of the second reactor section.

The position of the at least one second feed line along the flow direction of the main stream defines the beginning of the second reactor section and of its first subsection. The second reactor section and its first subsection begin at the plane through the most upstream point of the at least one second feed line in the flow direction of the main stream. The plane is perpendicular to the flow direction of the main stream of the plasma gas at said most upstream point of the at least one second feed line.

This is illustrated in FIGS. 1 and 2 wherein the at least one second feed line (70) defines the beginning of the second reactor section (30). In FIG. 2 the point in the flow direction of the main stream (71) at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode is upstream in the flow direction of the main stream of the beginning of the second reactor section (30), i.e., the at least one second feed line, and thus located in the plasma section downstream in the flow direction of the main stream of the foot points of the electric arc on the inner surface of the hollow channel of the anode.

In preferred embodiments, the reactor comprises at least one sudden expansion which is positioned between the foot points of the electric arc on the inner surface of the hollow channel of the anode and the most upstream point in the flow direction of the main stream at which the flow cross-section transverse to the flow direction of the main stream (71) is greater by at least a factor of 5, preferably a factor of 10, in comparison with the average flow cross-section of the anode transverse to the flow direction of the main stream in the range of the foot points of the electric arc on the inner surface of the hollow channel of the anode. The sudden expansion is a sudden expansion of the flow cross-section transverse to the flow direction of the main stream which has an opening angle of at least 20°, preferably at least 45°, more preferred at least 75°, into the flow direction of the main stream relative to the main stream axis. This reactor configuration helps to mix the $C_1$- to $C_4$-alkane-containing gas which is introduced into the reactor via the at least one second feed line and the plasmaeous plasma gas and to broaden the residence time distribution of the atoms of the mixture. Especially, the sudden expansion improves backmixing of a portion of solid particles rich in carbon whose surfaces have a catalytic impact on decomposition of hydrocarbons and which may grow to a larger size through backmixing. Also, further means like means for the induction of turbulence and/or backmixing may broaden the residence time distribution and further improve the device and the process of the present invention. Hence, in some embodiments the second reactor section comprises at least one additional device for inducing additional turbulence and/or backmixing of the mixture, preferably being positioned downstream of the at least one second feed line in the flow direction of the main stream. In some embodiments, the at least one additional device is positioned downstream of the most upstream point in the flow direction of the main stream at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode. In these embodiments, the at least one additional device may be positioned downstream of the at least one second feed line in the flow direction of the main stream. The at least one additional device for inducing turbulence and/or backmixing of the mixture may be selected from the group consisting of a passive grid, a static mixer, a bend of the reactor, and combinations thereof, wherein preferably the bend of the reactor induces a change of the flow direction of the mixture relative to the flow direction of the main stream by at least 80°, preferably at least 135°. In certain embodiments of the present invention, the reactor comprises two or more sudden expansions, preferably in the second reactor section, more preferably in the first and/or second subsection of the second reactor section.

In preferred embodiments, at least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section.

The residence time, the mean residence time, and the residence time distribution in the second reactor section, if not specified otherwise, refers to the residence time, the mean residence time, and the residence time distribution in the total second reactor section.

The term "in absolute numbers by at least 5% deviation from the mean residence time" means that the corresponding atoms have a residence time of up to 95% or 105% and more relative to the mean residence time.

Preferably, at least 10% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 10% from the mean residence time of all atoms of the mixture resulting from the plasmaeous plasma gas leaving the plasma section and the $C_1$- to $C_4$-alkane-containing gas of the at least one second feed line in the second reactor section, more preferred by at least 15%, even more preferred by at least 20%, from the mean residence time of all atoms of the mixture resulting from the plasmaeous plasma gas leaving the plasma section and the $C_1$- to $C_4$-alkane-containing gas of the at least one second feed line in the second reactor section.

In further embodiments, the flow cross-section transverse to the flow direction of the main stream in the range from the foot points of the electric arc on the inner surface of the hollow channel of the anode down to the most upstream point in the flow direction of the main stream at which the flow cross-section transverse to the flow direction of the main stream is greater by at least a factor of 5, preferably a factor of 10, in comparison with the average flow cross-section of the anode transverse to the flow direction of the main stream in the range of the foot points of the electric arc on the inner surface of the hollow channel of the anode is at any point at least 60%, preferably at least 80%, more preferred at least 90%, relative to the average flow cross-section transverse to the flow direction of the main stream at the foot points of the electric arc on the inner surface of the hollow channel of the anode. This ensures that there is, if at all, only a limited reduction of the flow cross-section between the foot points of the electric arc on the inner surface of the hollow channel of the anode and the point at which the flow cross-section transverse to the flow direction of the main stream is enlarged. This prevents an undesired pressure drop and material stress in this zone of the reactor.

To define the necessary residence times of the atoms of the mixture, the device is characterized by certain volume ratios of the individual sections. Reference is the volume of the plasma section which begins at the most upstream position at which the inner surface of the hollow channel of the anode is facing the electric arc and reaches down to the end of the plasma section of the reactor. The term "the volume of the plasma section which begins at the most upstream position at which the inner surface of the hollow channel of the anode is facing the electric arc and reaches down to the end of the plasma section" refers to the inner volume of the hollow channel of the anode which begins at the plane through the most upstream point of the hollow channel of the anode facing, in perpendicular direction relative to the inner surface of the anode at said point, the electric arc and wherein said plane is perpendicular to the flow direction of the main stream at said most upstream point of the anode and which ends at the plane perpendicular to the end point of the plasma section of the reactor in the flow direction of the main stream. This volume is highlighted in FIGS. 1 and 2 by reference sign (22). The reference volume has a volume in the range of 0.0001 $m^3$ to 0.4 $m^3$, preferably in the range of 0.001 $m^3$ to 0.2 $m^3$. The volume of the first subsection of the second reactor section and the total second reactor section are defined in relation to the reference volume. The volume of the first subsection of the second reactor section is in the range of 10 to 200 times the reference volume, preferably in the range of 20 to 100 times the reference volume, whereas the volume of the total second reactor section is in the range of 20 to 2000 times the reference volume, preferably in the range of 40 to 1000 times the reference volume.

The term volume as used herein refers to the inner volume of a certain object. This means in the context of the reference volume that the reference volume concerns the inner volume of the hollow channel of the anode filled out by plasma gas. Not comprised is thus the wall of the hollow channel of the anode or cooling means which may be connected with or comprised in the anode. In the context of the volume of the second reactor section this means that the volume as used herein concerns the inner volume of the second reactor section starting with the plane perpendicular to the flow direction of the main stream at the point of the transition from the plasma section to the second reactor section down to the end of the second reactor section and filled out by the components of the plasmaeous plasma gas leaving the plasma section and the $C_1$- to $C_4$-alkane-containing gas of the at least one second feed line. In the context of the volume of the first subsection of the second reactor section it means that the volume as used herein concerns the inner volume of the first subsection of the second reactor section starting with the plane perpendicular to the flow direction of the main stream at the point of the transition from the plasma section to the second reactor section down to the end of the first subsection of the second reactor section and filled out by the components of the plasmaeous plasma gas leaving the plasma section and the $C_1$- to $C_4$-alkane-containing gas of the at least one second feed line.

Preferably, the $C_1$- to $C_4$-alkane-containing gas is introduced transversely to the flow direction of the main stream via the at least one second feed line into the plasmaeous plasma at a position downstream from the foot points of the electric arc on the inner surface of the hollow channel of the anode in the flow direction of the main stream. The at least one reactor may thus be configured such that the at least one second feed line introduces the $C_1$- to $C_4$-alkane-containing gas into the plasmaeous plasma gas transversely to the flow direction of the main stream. A transverse introduction includes introductions with angles in the range of 80 to 100°, preferably 85 to 95°, relative to the axis of the main stream. This further improves the mixing of the plasmaeous plasma gas and the $C_1$- to $C_4$-alkane-containing gas introduced via the at least one second feed line.

Absolute flow rates of the plasma gas are typically in the range of 2 $m^3$/h to 40,000 $m^3$/h. Obviously, the specific flow rate is set depending on the details of the selected reactor design. So, it is unlikely to combine the highest flow rate specified with a plasma section reference volume of 0.0001 $m^3$. Therefore, the ranges of parameters described herein shall be understood as ranges within which the person skilled in the art would select the appropriate parameter settings to run the device of the invention and put the process of the invention into practice.

Preferably, the ratio of the flow rate of the second feed gas to the flow rate of the feed plasma gas in terms of norm cubic meters per hour is set to fall within the range of 0.1 to 1.5. Preferably, the temperature of the plasma gas introduced into the plasma section via the at least one first feed line prior to injection into the first reactor section is in the range of 20° C. to 600° C. This may involve heating of the plasma gas prior to its introduction into the plasma section, e.g., using a heat exchanger. Also preferably, the temperature of the $C_1$- to $O_4$-alkane-containing gas introduced via the at least one second feed line into the second reactor section may be in the range of 20° C. to 1000° C. Here again, a heat exchanger may be used to heat the gas to a temperature falling within this range. The ratio of the streams and the temperature of the streams after preheating are means to adjust the temperature profile of the mixture in the second reactor section. Other means are, e.g., the specific energy input of the electrical arc in terms of kilowatt-hours of electrical energy per norm cubic meter of plasma gas, and the composition of the feed plasma gas and the $C_1$- to $C_4$-alkane-containing gas introduced via the at least one second feed line.

If the device includes a heat exchanger, the heat exchanger may receive heat from the mixture leaving the reactor. Hence, in certain embodiments the outlet means of the second reactor section are connected with a heat exchanger (120). Alternatively, the heat exchanger may receive heat from steam or by at least one burner. Preferably, the burner is fueled using fuel which contains a portion of the hydrogen that was previously produced in the reactor of the device of the present invention.

Alternatively, the device includes two heat exchangers which may receive the mixture or at least a portion of the mixture leaving the reactor. In a preferred embodiment, both heat exchangers are connected in parallel to the outlet means of the reactor. In another preferred embodiment the heat exchangers are connected in a row, i.e., one heat exchanger is connected directly to the outlet means of the reactor and the other heat exchanger is connected to the outlet of the first heat exchanger. Hence, plasma gas injected into the plasma section via the at least one first feed line may be preheated together with the $C_1$- to $C_4$-alkane-containing gas introduced via the at least one second feed line by one heat exchanger. Alternatively, plasma gas injected into the plasma section via the at least one first feed line may be preheated separately from the $C_1$- to $C_4$-alkane-containing gas introduced via the at least one second feed line by one of the two said heat exchangers connected in parallel to the outlet means of the reactor or connected in a row and the $C_1$-$C_1$- to $C_4$-alkane-containing gas introduced via the at least one second feed line by the other of the said two heat exchangers connected in parallel to the outlet means of the reactor or connected in a row. If the two heat exchangers are connected in row, the first heat exchanger which is connected with the stream withdrawn via outlet (33) may also be connected to the at least one first line (60) to transfer the heat to the plasma gas before introduction into the plasma section via the at least one first feed line (60). The second heat exchanger may be connected with the at least one second feed line (70) to transfer residual heat from the stream leaving the first heat exchanger to the gas introduced into the first subsection of the second reactor section via the at least one second feed line (70).

In a preferred embodiment, the device includes a heat exchanger connected with the outlet means of the reactor to receive the mixture or at least a portion of the mixture leaving the reactor to produce steam, and to cool simultaneously the mixture. In a further preferred embodiment, the device includes both said one heat exchanger for steam generation and said one or two heat exchangers to preheat the plasma gas injected into the plasma section via the at least one first feed line and/or the $C_1$- to $C_4$-alkane-containing gas introduced via the at least one second feed line. In a preferred process, the heat exchangers are operated at variable loads depending on the circumstances, e.g., availability of renewable electricity and/or demand for heat and/or the cost of electricity. More specifically, in a preferred process, dependent on the circumstances, e.g., at high availability of renewable electricity and/or demand for heat, a larger portion or all of the mixture leaving the reactor will be used generate heat for external heat use. In case of low availability of renewable electricity and/or low demand of heat, little or no heat will be generated from the mixture for external use and instead the mixture will be used to preheat the plasma gas injected into the plasma section via the at least one first feed line and/or the $C_1$- to $C_4$-alkane-containing gas introduced via the at least one second feed line to reduce the specific electrical energy consumption in the reactor for production of hydrogen and solid carbon.

In certain embodiments, the device for the production of hydrogen and solid carbon according to the present invention further comprises at least one device for enrichment of solid components, preferably carbon black, formed in said reactor, wherein said at least one device for enrichment of solid components, preferably carbon black, separates gaseous components from solid components, preferably carbon black, of the mixture to enrich the solid components, preferably carbon black, of the mixture, wherein the at least one device for enrichment of solid components, preferably carbon black, a) is in fluid communication with the outlet means of the reactor, and b) has at least one outlet for a stream comprising an enriched concentration of solid components, preferably carbon black, compared to the mixture entering the at least one device for enrichment of solid components, preferably carbon black, and c) has at least one outlet for a stream comprising gaseous components of the mixture and a decreased concentration of solid components, preferably carbon black, compared to the mixture entering the at least one device for enrichment of solid components, preferably carbon black.

In some embodiments, the at least one device for the enrichment of solid components of the mixture is selected from the group consisting of a cyclone, in particular a high temperature cyclone, a filter, preferably a high temperature filter, a device containing a fixed or fluidized bed of solid particles, a scrubber, preferably a scrubber using a water-containing scrubbing medium or an oil-based scrubbing medium, and combinations thereof.

In certain embodiments, the total volume of the volume of the second reactor section starting with the plane perpendicular to the flow direction of the main stream at the point of the transition from the plasma section to the second reactor section down to the end of the second reactor section and the volume of the device for enrichment of solid components of the mixture is in the range of 20 to 2000 times the reference volume, preferably 40 to 1000 times the reference volume.

The solid carbon of the present invention preferably comprises carbon black or is carbon black. Typically, industrial carbon black contains or is an agglomerate of primary particles with a particle diameter in the range of a few nanometers to 500 nm. There exist different types of carbon black which differ from each other, e.g., with respect to the particle diameter and/or the specific surface area. The term solid carbon refers to carbon in the reactor space which is solid under the reaction conditions. One example for a solid carbon is an agglomerate of carbon atoms.

In further embodiments, the device of the present invention comprises at least one device for the enrichment of solid components which is connected to the outlet of the second reactor section, wherein a heat exchanger is connected with the outlet of the at least one device for enrichment of solid carbon black containing the mixture with a lower solid concentration compared to the feed of the at least one device for enrichment of solid carbon black.

In some embodiments, the device for the production of hydrogen and solid carbon, besides the at least one device for enrichment of solid components, preferably carbon black, comprises at least one device for enrichment of hydrogen from the stream comprising gaseous components of the mixture and a decreased concentration of solid components, preferably carbon black, compared to the mixture entering the at least one device for enrichment of solid components, preferably carbon black, wherein the at least one device for enrichment of hydrogen a) is in fluid communication with the outlet for a stream comprising gaseous components of the mixture and a decreased concentration of solid components, preferably carbon black, of the at least one device for enrichment of solid components, preferably carbon black, of the mixture, and b) has at least one outlet for a stream comprising an enriched concentration of hydrogen compared to the stream comprising gaseous components of the mixture and a decreased concentration of solid components, preferably carbon black, entering the at least one device for enrichment of hydrogen, and c) has at least one outlet for a stream comprising a decreased concentration of hydrogen compared to the stream comprising gaseous components of the mixture and a decreased concentration of solid components, preferably carbon black, entering the at least one device for enrichment of hydrogen.

In some embodiments, the at least one outlet for a stream comprising a decreased concentration of hydrogen compared to the stream comprising gaseous components of the mixture and a decreased concentration of solid components, preferably carbon black, entering the at least one device for enrichment of hydrogen is connected with a storage container, preferably a pressure vessel with a pressure higher than the original pressure of the stream. The gas stored therein may contain unsaturated hydrocarbons such as ethylene and acetylene and may be useful as fuel.

In a preferred embodiment, the outlet for a stream comprising a decreased concentration of hydrogen compared to the stream comprising gaseous components of the mixture and a decreased concentration of solid components, preferably carbon black, entering the at least one device for enrichment of hydrogen is connected to a burner which allows to burn at least a portion of the gas.

In further embodiments, at least a portion of the stream comprising a decreased concentration of hydrogen compared to the stream comprising gaseous components of the mixture and a decreased concentration of solid components, preferably carbon black, entering the at least one device for enrichment of hydrogen is used as feedstock and fed back into the reactor, preferably via the at least one first, second, and/or third feed line (if available), more preferably via the at least one second feed line. Preferably, said use as feedstock varies over time and is made dependent on the mode of reactor operation and/or specific boundary conditions. For example, said stream could be used as feedstock in the reactor preferably at electricity prices which are equal to or exceed a threshold value to be defined. In a preferred embodiment, the outlet for a stream comprising a decreased concentration of hydrogen compared to the stream comprising gaseous components of the mixture and a decreased concentration of solid components, preferably carbon black, entering the at least one device for enrichment of hydrogen is also connected to a flare and/or a burner to produce process heat. Thus, for example at least a portion of oxygen containing components from the gas, like carbon monoxide, which may result from $CO_2$ in natural gas or other oxygen-containing components in the feedstock as well as inert gases like $N_2$ in the $C_1$- to $C_4$-alkane-containing gas introduced via the at least one first feed line and/or via the at least one second feed, such as $N_2$ in natural gas, can be removed.

In further embodiments, the device for the production of hydrogen and solid carbon according to the present invention comprises a reactor having means, preferably two distinct means, to detachably connect the anode or a portion of the anode with the rest of the reactor. Preferably, one of said two distinct means is positioned in the flow direction of the main stream upstream of the foot points of the electric arc on the inner surface of the hollow channel of the anode and the other one of said two distinct means is positioned in the flow direction of the main stream downstream of the foot points of the electric arc on the inner surface of the hollow channel of the anode. Said means to detachably connect the anode or a portion of the anode with the rest of the reactor are positioned upstream of the at least one second feed line in the flow direction of the main stream. In some embodiments, there is in the range starting downstream in the flow direction of the main flow of the foot points of the electric arc on the inner surface of the hollow channel of the anode reaching to upstream in the flow direction of the main stream of the at least one second feed line the most upstream point at which the flow cross-section transverse to the flow direction of the main stream is greater by at least a factor 5, preferably by at least a factor of 10, in comparison with the average flow cross-section of the anode transverse to the flow direction of the main stream in the range of the foot points of the electric arc on the inner surface of the hollow channel of the anode. This means the point at which the flow cross-section transverse to the flow direction of the main stream is greater by at least a factor 5, preferably by at least a factor of 10, in comparison with the average flow cross-section of the anode transverse to the flow direction of the main stream in the range of the foot points of the electric arc on the inner surface of the hollow channel of the anode (the expansion of the flow cross-section) may already be present in the space between the foot points of the electric arc and the second feed line. Even more preferred, there is further a sudden expansion of the flow cross-section transverse to the flow direction of the main stream upstream in the flow direction of the main stream of the most upstream point at which the flow cross-section transverse to the flow direction of the main stream is greater by at least a factor 5, preferably by at least a factor of 10, in comparison with the average flow cross-section of the anode transverse to the flow direction of the main stream in the range of the foot points of the electric arc on the inner surface of the hollow channel of the anode. Under these circumstances, the means positioned in the flow direction of the main stream downstream of the foot points of the electric arc on the inner surface of the hollow channel of the anode are positioned in the flow direction of the main stream upstream of the most upstream point at which the flow cross-section transverse to the flow direction of the main stream is greater by at least a factor 5, preferably by at least a factor of 10, in comparison with the average flow cross-section of the anode transverse to the flow direction of the main stream in the range of the foot points of the electric arc on the inner surface of the hollow channel of the anode, even more preferred upstream of the sudden expansion of the flow cross-section transverse to the flow direction of the main stream. This allows fast, easy, and efficient replacement of the anode if necessary. In particular, extended reactor down times are omitted and substantial reactor disassembly to replace the anode is avoided.

In some embodiments, the device for the production of hydrogen and solid carbon according to the present invention comprises a reactor having means, preferably two distinct means, to detachably connect the cathode or a portion of the cathode with the rest of the reactor. Said means to detachably connect the cathode or a portion of the cathode with the rest of the reactor are positioned upstream of the at least one second feed line in the flow direction of the main stream. Preferably, the cathode has a hollow channel in which the electric arc stretches and wherein the foot points of the electric arc contact the inner surface of the hollow channel of the cathode. Under these circumstances, one of said two distinct means may be positioned in the flow direction of the main stream upstream of the foot points of the electric arc on the inner surface of the hollow channel of the cathode and the other one of said two distinct means may be positioned in the flow direction of the main stream downstream of the foot points of the electric arc on the inner surface of the hollow channel of the cathode.

In preferred embodiments, the inner surface of the hollow channel of the anode at its end in the flow direction of the main stream is flush with the inner surface of the second reactor section at its beginning in the flow direction of the main stream (cf. FIGS. 1 and 2). Hence, in both embodiments, at the transition of the anode to the second reactor section in the flow direction of the main stream, there is no segment of the anode wall which is contacted by process gas from two opposing sides. Preferably, there is a steady passage from the inner surface of the hollow channel of the anode and the inner surface of the first subsection of the second reactor section. This is advantageous because it allows an improved control of the flows and reactions in the reactor and avoids undesired deposition of tars or solids.

Under these circumstances, the reactor may contain means for shutting the flow channel below the detachable anode to close the path for the plasmaeous plasma gas to the second reactor section. Preferably, the means for shutting the connection is positioned between the anode and the beginning of the second reactor section. Preferably, the means for shutting is a valve or a slide. In a more preferred embodiment, the means for shutting is cooled, preferably by a liquid, even more preferred by water.

In certain embodiments, the at least one reactor has at least one third feed line for introducing $C_1$- to $C_4$-alkane-containing gas into the second reactor section, the at least one third feed line for introducing $C_1$- to $C_4$-alkane-containing gas being arranged in the flow direction of the main stream downstream of the at least one second feed line for introducing a $C_1$- to $C_4$-alkane-containing gas into the second reactor section, preferably the position of the at least one third feed line defines the beginning of the second subsection of the second reactor section (32). The introduction of a $C_1$- to $C_4$-alkane-containing gas via at least one third feed line downstream of the at least one second feed line is advantageous to improve control of temperature and reactions along the path of the main flow.

The mixture produced by the device and process of the present invention containing hydrogen and solid carbon withdrawn via the outlet means (33) may be stored. The storage may be intermediate, e.g., for buffer purposes in a coordinated process, or longer periods of time. For example, the mixture may be stored in a pressurized vessel. Such a pressurized vessel may enable to store gas at elevated pressure of up to 200 bar. In certain embodiments, first the amount of solid carbon is reduced. Then, the remaining mixture containing crude (at reduced amount of solid carbon and/or further components) or refined hydrogen may be stored in the vessel.

The process for the production of hydrogen and solid carbon from $C_1$- to $C_4$-alkane-containing gas by means of thermal plasma is characterized in that the process comprises at least steps a) to h) as defined in the appended claims. In step a) a $C_1$- to $C_4$-alkane-containing plasma gas is withdrawn from a device for providing a $C_1$- to $C_4$-alkane-containing gas. Such a device is herein disclosed also as a device for supply of $C_1$- to $C_4$-alkane-containing gas. In preferred embodiments, the process employs a device and reactor according to the present invention.

In step e), the introduction of a $C_1$- to $C_4$-alkane-containing gas into the first subsection of the second reactor section via the at least one second feed line for introducing a $C_1$- to $C_4$-alkane-containing gas into the second reactor section is carried out in such a way that the $C_1$- to $C_4$-alkane-containing gas which is introduced into the second reactor section via the at least one second feed line is introduced into the plasmaeous plasma gas in the flow direction of the main stream downstream of the foot points of the electric arc produced by the anode and cathode, so that in the first subsection of the second reactor section downstream of the at least one second feed line a mixture is formed from the plasmaeous plasma gas leaving the plasma section and the $C_1$- to $C_4$-alkane-containing gas which is introduced into the first subsection of the second reactor section via the at least one second feed line.

The plasmaeous plasma gas at the position at which the $C_1$- to $C_4$-alkane-containing gas is introduced into the plasmaeous plasma gas via the at least one second feed line has a mean temperature in the range of 1200 to 3000° C., preferably in the range of 1500 to 2800° C. Meant with this is the mean temperature which the plasmaeous plasma gas would have at said position if no $C_1$- to $C_4$-alkane-containing gas was introduced into the plasmaeous plasma gas via the at least one second feed line.

It is key that the plasmaeous plasma gas comprises acetylene before the injection of $C_1$- to $C_4$-alkane-containing gas via the at least one second feed line into the plasmaeous plasma gas. Preferably, the plasmaeous plasma gas at the position at which the $C_1$- to $C_4$-alkane-containing gas is introduced into the plasmaeous plasma gas via the at least one second feed line comprises at least 2 vol. %, preferably at least 4 vol. %, even more preferably at least 6 vol. %, most preferably more than 8 vol. % acetylene.

A mixture is formed resulting from the introduction of the $C_1$- to $C_4$-alkane-containing gas via the at least one second feed line into the plasmaeous plasma gas. The mixture has in the range from the at least one second feed line down to the end of the first subsection of the second reactor section a mean temperature of at least 850° C., preferably at least 1050° C., and less than 3000° C., preferably less than 2800° C.

In the second subsection of the second reactor section the mean temperature of the mixture is at least 650° C., preferably at least 750° C., more preferably at least 850° C. and less than 1500° C., preferably in the range of 700° C. to 1400° C., more preferably in the range of 800° C. to 1300° C., most preferred in the range of 800° C. to 1200° C., wherein the mean temperature of the mixture resulting from the plasmaeous plasma gas and the $C_1$- to $C_4$-alkane-containing gas introduced via the at least second feed line at the end of the second reactor section is at least 200 K, preferably at least 400 K, more preferably at least 600 K, lower than the mean temperature of the plasmaeous plasma gas at the position at which the $C_1$- to $C_4$-alkane-containing gas is introduced into the plasmaeous plasma gas via the at least one second feed line. This mean temperature is significantly higher than that used in the prior art of reactors and processes for acetylene production and further improves the efficiency of the process. This applies also to the process and use of a reactor of the present invention.

Step f) comprises passing the mixture downstream through the second reactor section in the flow direction of the main stream, wherein said passing is such that in the first subsection of the second reactor section the mean residence time of the atoms in the mixture resulting from the plasmaeous plasma gas leaving the plasma section and the $C_1$- to $C_4$-alkane-containing gas of the at least one second feed line is in the range of 100 ms to 2000 ms, preferably in the range of 200 ms to 1000 ms, more preferably in the range of 400 ms to 900 ms, further preferred in the range of 500 ms to 800 ms. Hence, the mean temperature of the mixture and the mean residence time of its atoms in the first subsection of the second reactor section are essential for an efficient operation of the process. Step f) further specifies that the passing is such that in the total second reactor section including the second subsection of the second reactor section the mean residence time of the atoms of the mixture resulting from the plasmaeous plasma gas leaving the plasma section and the $C_1$-$C_1$- to $C_4$-alkane-containing gas of the at least one second feed line is in the range of 200 ms to 20000 ms, preferably in the range of 400 ms to 10000 ms, more preferably in the range of 600 ms to 9000 ms, further preferred in the range of 800 ms to 8000 ms, even further preferred in the range of 1000 ms to 7500 ms. Also, for the total second reactor section including the second subsection of the second reactor section, the mean temperature of the mixture and the mean residence time of its atoms are essential for an efficient operation of the process.

Furthermore, step f) specifies that at least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section, wherein preferably at least 10% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 10% from the mean residence time of all atoms of the mixture resulting from the plasmaeous plasma gas leaving the plasma section and the $C_1$- to $C_4$-alkane-containing gas of the at least one second feed line in the second reactor section, more preferred by at least 15%, even more preferred by at least 20%, from the mean residence time of all atoms of the mixture resulting from the plasmaeous plasma gas leaving the plasma section and the $C_1$- to $C_4$-alkane-containing gas of the at least one second feed line in the second reactor section. So, not only the mean residence time of the atoms of the mixture but also the residence time distribution is relevant and controlled. Accordingly, hydrogen and solid carbon, preferably carbon black, are produced also in the second reactor section. Overall, hydrogen and solid carbon, preferably carbon black, are produced in the reactor at lower energy expenses because the process and device parameters are defined such to maximize the use of the acetylene decomposition heat for provision of energy needed for the conversion of $C_1$- to $C_4$-alkane-containing gas into hydrogen and solid carbon in the second reactor section.

As for the device of the present invention, the process of the present invention which is identified above and in the appended claims may include steps to enrich the solids and hydrogen from the mixture. So, the process may further comprise step i) treating the mixture withdrawn via the outlet means with at least one device for enrichment of solid components of the mixture, preferably carbon black, to produce a stream comprising an enriched concentration of the solid components of the mixture, preferably carbon black, and a stream comprising gaseous components of the mixture and a decreased concentration of solid components of the mixture, preferably carbon black. Preferably, step i) is carried out in at least one device for enrichment of solid components, preferably carbon black, formed in the reactor, wherein said at least one device for enrichment of solid components, preferably carbon black, is used to separate gaseous components from solid components, preferably carbon black, of the mixture to enrich the solid components of the mixture, preferably carbon black, wherein the at least one device for enrichment of solid components is in fluid communication with the outlet means of the reactor, and has at least one outlet for a stream comprising an enriched concentration of solid components, preferably carbon black, compared to the mixture entering the at least one device for enrichment of solid components, preferably carbon black, and has at least one outlet for a stream comprising gaseous components of the mixture and a decreased concentration of solid components, preferably carbon black, compared to the mixture entering the at least one device for enrichment of solid components, preferably carbon black. Preferred examples for such devices are disclosed herein.

In some embodiments, the mean residence time of the atoms of the mixture resulting from the plasmaeous plasma gas leaving the plasma section and the $C_1$- to $C_4$-alkane-containing gas of the at least one second feed line in the range from the beginning of the second reactor section down to and including the device for enrichment of solid components, preferably carbon black, of the mixture is in the range of 200 ms to 20000 ms, preferably in the range of 400 ms to 10000 ms, more preferably in the range of 600 ms to 9000 ms, further preferred in the range of 800 ms to 8000 ms, even further preferred in the range of 1000 ms to 7500 ms. This is because the temperature profile defined in the process of the present invention allows under certain circumstances further $C_1$- to $C_4$-alkane-containing gas conversion to hydrogen and solid carbon on the passage of the mixture from the outlet of the second reactor section up to and including the device for enrichment of solid components, preferably carbon black. The total inner volume of the device for enrichment of solid components filled out by the mixture leaving the second reactor section and the inner volume of the connection of the device for enrichment of solids, preferably carbon black, to the outlet means of the second reactor section may be in the range of 10 to 1800 times the reference volume as specified further above, preferably in the range of 20 to 800 times the reference volume.

The process of the present invention including the device for enrichment of solid components may further include step j) treating the stream comprising gaseous components of the mixture and a decreased concentration of solid components of the mixture, preferably carbon black, with at least one device to produce a stream having an enriched concentration of hydrogen compared to the stream comprising gaseous components of the mixture and a decreased concentration of solid components of the mixture, preferably carbon black. Preferably, step j) is carried out in at least one device for enrichment of hydrogen from the stream comprising gaseous components of the mixture and a decreased concentration of solid components, preferably carbon black, compared to the mixture entering the at least one device for enrichment of solid components, preferably carbon black, wherein the at least one device for enrichment of hydrogen is in fluid communication with at least one outlet for a stream comprising a decreased concentration of solid components, preferably carbon black, of the at least one device for enrichment of solid components, preferably carbon black, of the mixture, and has at least one outlet for a stream comprising an enriched concentration of hydrogen compared to the stream comprising gaseous components of the mixture and a decreased concentration of solid components, preferably carbon black, entering the at least one device for enrichment of hydrogen, and has at least one outlet for a stream comprising gaseous components of the mixture and a decreased concentration of hydrogen compared to the stream comprising a decreased concentration of solid components, preferably carbon black, entering the at least one device for enrichment of hydrogen.

In certain embodiments, the process is run such that the reactor comprises in the first subsection of the second reactor section and/or in the plasma section in the range downstream in the flow direction of the main stream of the foot points of the electric arc on the inner surface of the hollow channel of the anode down to the end of the plasma section, at least at one point a flow cross-section transverse to the flow direction of the main stream which is greater by at least a factor of 5, preferably by at least a factor of 10, in comparison with the average flow cross-section of the anode transverse to the flow direction of the main stream in the range of the foot points of the electric arc on the inner surface of the hollow channel of the anode. Preferably, the pressure directly upstream of the most upstream point in the flow direction of the main stream at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode is in the range of 0.5 to 30 bar overpressure or bar gauge respectively.

In a further embodiment of the process of the present invention, the wall of the second reactor section is cooled, more preferably cooled by a fluid, even more preferably cooled by a liquid, even more preferably cooled by a liquid with a temperature of up to 450° C. This, of course, also applies to the device of the present invention which may thus comprise a reactor having a second reactor section with a cooled wall, more preferably cooled by a liquid, even more preferably cooled by a liquid with a temperature of up to 450° C.

In some embodiments of the process, the $C_1$- to $C_4$-alkane-containing gas is introduced via the second feed line into the plasmaeous plasma gas transversely to the flow direction of the main stream. This improves mixing of the mixture.

Also, the process may comprise that at least a third introduction of $C_1$- to $C_4$-alkane-containing gas into the second reactor section is carried out, the third introduction being carried out via an at least one third feed line which is arranged in the flow direction of the main stream downstream of the at least one second feed line for the introduction of $C_1$- to $C_4$-alkane-containing gas into the second reactor section, and wherein preferably the position of the at least one third feed line defines the beginning of the second subsection of the second reactor section.

To further improve the process, it may comprise that solid carbon, preferably carbon black, preferably carbon black which is a portion of solid carbon, preferably carbon black, produced in said process and separated according to the process of the invention, preferably said portion having different average properties compared to the total amount of solid carbon, preferably carbon black, produced in said process such as different average particle size or specific surface area, preferably dispersed in a hydrogen and/or $C_1$- to $C_4$-alkane-containing gas, is introduced into the second reactor section. Solid carbon, preferably carbon black, having a specific average particle size or specific surface area may be obtained by fractionation of the solid carbon material, preferably carbon black material. The dispersed carbon black may be a portion derived from carbon black produced in a process according to the present invention including the separation of carbon black. The solid carbon, preferably carbon black, dispersed in a hydrogen- and/or $C_1$- to $C_4$-alkane-containing gas is introduced into the second reactor section either directly or, preferably, by introduction into the at least one second feed line for introducing a $C_1$- to $C_4$-alkane-containing gas into the first subsection of the second reactor section. Preferably, solid carbon, preferably carbon black, is introduced into the at least one second feed line for introducing a $C_1$- to $C_4$-alkane-containing gas into the first subsection of the second reactor section.

If said solid carbon-, preferably carbon black-, containing gas stream is introduced directly into the second reactor section, it may have right before the point of introduction into the second reactor section a concentration of solid carbon, preferably carbon black, in the range of 1 $g/m_N^3$ to 100 $g/m_N^3$. Preferably, if said solid carbon-, preferably carbon black-, containing gas stream is introduced directly into the second reactor section, the ratio of the flow rate of the solid carbon-, preferably carbon black-, containing gas stream right before the point of introduction into the second reactor section to the sum of the flow rate of the $C_1$- to $C_4$-alkane-containing plasma gas stream and the flow rate of the $C_1$- to $C_4$-alkane-containing gas stream of the at least one second feed line in terms of $m_N^3/h$ is in the range of 0.01% to 10%, preferably 0.1% to 5%.

And if said solid carbon-, preferably carbon black-, containing gas stream is introduced into the at least one second feed line for introducing a $C_1$- to $C_4$-alkane-containing gas into the first subsection of the second reactor section, it may have right before the point of introduction into the at least one second feed line for introducing a $C_1$- to $C_4$-alkane-containing gas into the first subsection of the second reactor section a concentration of solid carbon, preferably carbon black, in the range of 1 $g/m_N^3$ to 100 $g/m_N^3$. Preferably, if said solid carbon-, preferably carbon black-, containing gas stream is introduced into the at least one second feed line for introducing a $C_1$- to $C_4$-alkane-containing gas into the first subsection of the second reactor section, the ratio of the flow rate of the solid carbon-, preferably carbon black-, containing gas stream right before the point of introduction into the at least one second feed line to the sum of the flow rate of the $C_1$- to $C_4$-alkane-containing plasma gas stream and the flow rate of the $C_1$- to $C_4$-alkane-containing gas stream of the at least one second feed line in terms of $m_N^3/h$ is in the range of 0.01% to 10%, preferably 0.1% to 5%.

Said solid carbon, preferably carbon black, may have a specific surface area in the range of 1 to 1000 $m^2/g$, preferably in the range of 10 to 800 $m^2/g$, and most preferably in the range of 50 to 600 $m^2/g$. The specific surface area is determined using the method B.E.T. NSA as described in ASTM D6556-14 (approved Jun. 1, 2014, published July 2014, 10.1520/D6556-14) which is herewith incorporated by reference. Carbon black may act as a catalyst for various reactions, e.g., for splitting of natural gas into hydrogen and carbon black, in the reactor and further improve the yield and/or reaction kinetics. Also, introduction of carbon black particles may help to increase the average solid carbon particle size facilitating enrichment of the solid components of the mixture, preferably carbon black, in the device for enrichment of solid components, preferably carbon black, from the mixture. Accordingly, the process of the present invention may comprise introducing solid carbon, preferably carbon black, into the second reactor section, wherein preferably the solid carbon, preferably carbon black, has the above defined concentration and characteristics. The definition of the solid carbon, preferably carbon black, concentration by the units $g/m_N^3$ refers to grams per normal cubic meter.

As already noted above, the plasmaeous plasma gas at the position at which the $C_1$- to $C_4$-alkane-containing gas is introduced into the plasmaeous plasma gas via the at least one second feed line may comprise at least 2 vol. %, preferably at least 4 vol. %, even more preferably at least 6 vol. %, most preferably more than 8 vol. % acetylene.

To further improve the process, the electric arc generated by the anode and cathode may be rotated around an axis stretching from the cathode to the anode. This may be advantageous in the context of energy input into the plasma gas and to increase the lifetime of the electrodes. Preferably, as is for example shown in Acetylene, Paessler et al., Ullmann's Encyclopedia of Industrial Chemistry, doi: 10.1002/14356007.a01_097.pub4, 2011, the electric arc rotation is caused by means selected from the group consisting of a magnetic device, preferably positioned along the cathode and/or anode, or a device for inducing swirling of the $C_1$- to $C_4$-alkane-containing plasma gas, e.g., a so-called vortex chamber, right before its introduction into the plasma section, wherein preferably the electric arc is rotated around an axis which is oriented in the flow direction of the main stream. In preferred embodiments, the electric arc is rotated with a frequency of at least 0.1 $s^{-1}$, more preferably of at least 0.2 $s^{-1}$, even more preferably of at least 0.5 $s^{-1}$ around said axis. Preferably, the rotation of the electric arc is induced by a device for inducing swirling of the $C_1$- to $C_4$-alkane-containing plasma gas before its introduction into the plasma section.

Preferably, the process is characterized in that additional turbulence and/or backmixing in the mixture is induced in the second reactor section, in particular the additional turbulence in the mixture is induced in the flow direction of the main stream downstream from the at least one second feed line, preferably using at least one device for inducing turbulence of the mixture and/or backmixing, preferably selected from the group consisting of a passive grid, a static mixer, a bend of the reactor, and combinations thereof. This may improve further control of the mean residence times and the residence time distributions of the atoms of the mixture.

Further preferred is an embodiment of the process of the present invention wherein the anode and cathode of the at least one reactor are concentric, wherein the cathode has a hollow channel with the main axis extending along the flow direction of the main stream, wherein the hollow channel has two opposing ends, wherein the end facing into the direction opposite to the flow direction of the main stream is closed and wherein the end facing into the flow direction of the main stream of the plasma gas is open and positioned upstream and concentric to the open end of the anode facing into the direction opposite to the flow direction of the main stream, wherein the anode and cathode are arranged such that the foot points of the electric arc contact the inner surface of the hollow channel of the anode and the inner surface of the hollow channel of the cathode, respectively. Preferably, the anode and the cathode are arranged such that there is a gap in the direction of the main stream between the end of the cathode facing into the flow direction of the main stream and the end of the anode facing into the direction opposite to the flow direction of the main stream, wherein the length of said gap is preferably at least 0.3, more preferably at least 0.5, times the average inner diameter of the hollow channel of the anode in the range of the foot points of the electric arc on the inner surface of the hollow channel of the anode. Preferably, the plasma section is designed such that the introduction of the plasma gas into the plasma section of the reactor via the at least one first feed line is into said gap between the anode and cathode.

According to a further embodiment of the process of the present invention, the $C_1$- to $C_4$-alkane-containing plasma gas and/or the gas introduced via the at least one second feed line is natural gas or is a gas comprising methane. Hence, in some embodiments natural gas may be introduced into the reactor via both, the at least one first and the at least one second feed line. Alternatively, in certain embodiments methane may be introduced into the reactor via both, the first and the at least one second feed line.

As an independent aspect, the following invention is disclosed which may be incorporated in the invention defined by the appended claims, and vice versa.

The inventor surprisingly found that the introduction of acetylene-containing gas into the first subsection of the second reactor section concomitantly with the $C_1$- to $C_4$-alkane-containing gas via the at least one second feed line into the plasmaeous plasma gas derived from $C_1$- to $C_4$-alkane-containing gas, is advantageous for the production of hydrogen and solid carbon. The introduced acetylene decomposes in the second reactor section and generates heat which helps to increase faster the temperature of the $C_1$- to $C_4$-alkane-containing gas introduced into the second reactor section via the at least one second feed line and to drive further the conversion of the $C_1$- to $C_4$-alkane-containing gas to hydrogen and solid carbon production. The energy consumption of the process can thus be reduced and/or the capacity of a reactor increased compared to the prior art.

The independent aspect concerns a process, a device, and a use which are further characterized in the following.

Embodiment 1: Process for the production of hydrogen and solid carbon from $C_1$- to $C_4$-alkane-containing gas by means of thermal plasma, characterized in that the process comprises the steps a) withdrawing a $C_1$- to $C_4$-alkane-containing plasma gas from a device for providing a $C_1$- to $C_4$-alkane-containing gas;

b) introducing the $C_1$- to $C_4$-alkane-containing plasma gas withdrawn from the device for withdrawing a $C_1$- to $C_4$-alkane-containing plasma gas into at least a first reactor; wherein said reactor is a reactor for generating a thermal plasma by means of an electric arc, said reactor comprising i) a plasma section comprising an anode and a cathode for generating an electric arc, the arc extending within the plasma section, and at least one first feed line for introducing a $C_1$- to $C_4$-alkane-containing plasma gas into the plasma section of the reactor, wherein the anode has a hollow channel along the flow direction of the main stream of the plasma gas which has an inner surface, an outlet in the flow direction of the main stream of the plasma gas which forms the open end of the anode in the flow direction of the main stream, and at least one inlet for receiving the $C_1$- to $C_4$-alkane-containing plasma gas introduced into the plasma section of the reactor via the at least one first feed line wherein the inlet forms the open end of the anode facing into the direction opposite to the flow direction to the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode, and wherein said anode and said cathode are arranged so that the arc generated by them is formed in said plasma section to form a plasmaeous plasma gas in said plasma section from the $C_1$- to $C_4$-alkane-containing plasma gas introduced into said plasma section through said at least one first feed line, and wherein the foot points of the electric arc contacting the anode are located on the inner surface of the hollow channel of the anode, and ii) a second reactor section directly downstream of the plasma section of the reactor in the flow direction of the main stream, the second reactor section comprising a first subsection and a second subsection, wherein the second subsection is directly downstream of the first subsection in the flow direction of the main stream, and outlet means for withdrawing components from the reactor, wherein the outlet means are located at the end of the second reactor section in the flow direction of the main stream, wherein the first subsection comprises at least one second feed line for introducing a gas into the second reactor section, wherein the position of the at least one second feed line along the flow direction of the main stream defines the beginning of the second reactor section and of its first subsection, and wherein the $C_1$- to $C_4$-alkane-containing plasma gas is introduced into the reactor via the at least one first feed line for introducing a $C_1$- to $C_4$-alkane-containing plasma gas into the plasma section of the reactor;

c) generating an electric arc with the anode and cathode extending within the plasma section of the reactor;

d) forming a plasmaeous plasma gas in the plasma section of the reactor by means of the electric arc from the $C_1$- to $C_4$-alkane-containing plasma gas introduced into the plasma section via the at least one first feed line for introducing a $C_1$- to $C_4$-alkane-containing plasma gas into the plasma section;

e) introducing a gas mixture comprising $C_1$- to $C_4$-alkane and acetylene into the first subsection of the second reactor section via the at least one second feed line for introducing a gas into the second reactor section, wherein the introduction is carried out in such a way that the gas mixture comprising $C_1$- to $C_4$-alkane and acetylene, which is introduced into the second reactor section via the at least one second feed line, is introduced into the plasmaeous plasma gas in the flow direction of the main stream downstream of the foot points of the electric arc produced by the anode and cathode, so that in the first subsection of the second reactor section downstream of the at least one second feed line a mixture is formed from the plasmaeous plasma gas leaving the plasma section and the gas mixture comprising $C_1$- to $C_4$-alkane and acetylene which is introduced into the first subsection of the second reactor section via the at least one second feed line, f) passing the mixture downstream through the second reactor section in the flow direction of the main stream, wherein hydrogen and solid carbon are produced by the reactions taking place in the mixture in the second reactor section, and preferably in the plasma section; and g) withdrawing the mixture at the end of the reactor via outlet means for withdrawing the mixture from the reactor, wherein the outlet means are located at the end of the second reactor section in the flow direction of the main stream, wherein preferably the withdrawn mixture comprises acetylene in the range of 0.01 to 4 vol. %, preferably in the range of 0.1 to 1 vol. %.

Embodiment 2: Process for the production of hydrogen and solid carbon according to embodiment 1, wherein the process is run continuously and further comprises step h) treating the mixture withdrawn at the end of the reactor via the outlet means with at least one device for enrichment of solid components, preferably carbon black, formed in the said reactor, wherein said at least one device for enrichment of solid components, preferably carbon black, separates gaseous components from solid components, preferably carbon black, of the mixture to enrich the solid components, preferably carbon black, of the mixture, wherein the at least one device for enrichment of solid components, preferably carbon black, is in fluid communication with the outlet means of the reactor, to obtain a stream comprising an enriched concentration of solid carbon, preferably carbon black, compared to the mixture entering the at least one device for enrichment of solid components and a stream comprising gaseous components of the mixture and a decreased concentration of solid components compared to the mixture entering the at least one device for enrichment of solid components; and step i) treating the stream comprising gaseous components of the mixture and a decreased concentration of solid components, preferably carbon black, compared to the mixture entering the at least one device for enrichment of solid components, preferably carbon black, with at least one device for enrichment of hydrogen from the stream comprising gaseous components of the mixture and a decreased concentration of solid components, preferably carbon black, compared to the mixture entering the at least one device for enrichment of solid components, preferably carbon black, wherein the at least one device for enrichment of hydrogen separates hydrogen from other gaseous components, to obtain a stream comprising an enriched concentration of hydrogen compared to the mixture entering the at least one device for enrichment of hydrogen, and a stream comprising a reduced concentration of hydrogen compared to the mixture entering the at least one device for enrichment of hydrogen and acetylene, preferably an enriched concentration of acetylene compared to the mixture entering the at least one device for enrichment of hydrogen; and step j) introducing the stream comprising a reduced concentration of hydrogen compared to the mixture entering the at least one device for enrichment of hydrogen, and comprising acetylene, preferably an enriched concentration of acetylene compared to the mixture entering the at least one device for enrichment of hydrogen, or at least a portion of it into the at least one second feed line used in step step e) for introducing a gas mixture comprising $C_1$- to $C_4$-alkane and acetylene into the first subsection of the second reactor section.

Embodiment 3: Process for the production of hydrogen and solid carbon according to embodiment 1 or 2, wherein the acetylene concentration of the gas mixture of step e) comprising $C_1$- to $C_4$-alkane and acetylene is at least 2 vol. %, preferably at least 4 vol. %, even more preferably at least 6 vol. %, most preferably more than 8 vol. % acetylene.

Embodiment 4: Process for the production of hydrogen and solid carbon according to any one of embodiments 1 to 3, wherein the process further comprises the features of the process described in the appended claims and in the present description.

Embodiment 5: Device for the production of hydrogen and solid carbon from $C_1$- to $C_4$-alkane-containing gas by means of thermal plasma, characterized in that the device comprises:

at least one reactor for generating a thermal plasma by means of an electric arc, the reactor comprising i) a plasma section comprising an anode and a cathode for generating an electric arc, the arc extending within the plasma section, and at least one first feed line for introducing a $C_1$- to $C_4$-alkane-containing plasma gas into the plasma section of the reactor, wherein the anode has a hollow channel along the flow direction of the main stream of the plasma gas which has an inner surface, an outlet in the flow direction of the main stream of the plasma gas which forms the open end of the anode in the flow direction of the main stream, and at least one inlet for receiving the $C_1$- to $C_4$-alkane-containing plasma gas introduced into the plasma section of the reactor via the at least one first feed line wherein the inlet forms the open end of the anode facing into the direction opposite to the flow direction of the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode, and wherein said anode and said cathode are arranged so that the arc generated by them is formed in said plasma section to form a plasmaeous plasma gas in said plasma section from the $C_1$- to $C_4$-alkane-containing plasma gas introduced into said plasma section through said at least one first feed line, and wherein the foot points of the electric arc contacting the anode are located on the inner surface of the hollow channel of the anode, and ii) a second reactor section directly downstream of the plasma section of the reactor in the flow direction of the main stream, the second reactor section comprising a first subsection and a second subsection, wherein the second subsection is directly downstream of the first subsection in the flow direction of the main stream, and outlet means for withdrawing components from the reactor, wherein the outlet means are located at the end of the second reactor section in the flow direction of the main stream, wherein the first subsection comprises at least one second feed line for introducing a gas mixture comprising $C_1$- to $C_4$-alkane and acetylene into the second reactor section, wherein the position of the at least one second feed line along the flow direction of the main stream defines the beginning of the second reactor section and of its first subsection, wherein the at least one second feed line is arranged such that the gas mixture comprising $C_1$- to $C_4$-alkane and acetylene, which is introduced into the reactor via the at least one second feed line, is introduced into the plasmaeous plasma gas at a position downstream of the foot points of the electric arc in the flow direction of the main stream, so that in the first subsection of the second reactor section downstream of the at least one second feed line a mixture is formed from the plasmaeous plasma gas leaving the plasma section and the gas mixture comprising $C_1$- to $C_4$-alkane and acetylene of the at least one second feed line, wherein the at least one second feed line for introducing a gas mixture comprising $C_1$- to $C_4$-alkane and acetylene into the second reactor section is in fluid communication with a device for supply of an acetylene-containing gas.

Embodiment 6: Device for the production of hydrogen and solid carbon from $C_1$- to $C_4$-alkane-containing gas by means of thermal plasma according to embodiment 5, wherein the at least one second feed line for introducing a gas mixture comprising $C_1$-$C_1$- to $C_4$-alkane and acetylene is in fluid communication with a device for supply of $C_1$- to $C_4$-alkane-containing gas.

Embodiment 7: Device for the production of hydrogen and solid carbon from $C_1$- to $C_4$-alkane-containing gas by means of thermal plasma according to embodiment 5 or 6, wherein the device comprises:

iii) at least one device for enrichment of solid components, preferably carbon black, formed in the said reactor, wherein said at least one device for enrichment of solid components, preferably carbon black, separates gaseous components from solid components, preferably carbon black, of the mixture to enrich the solid components, preferably carbon black, of the mixture, wherein the at least one device for enrichment of solid components, preferably carbon black, is in fluid communication with the outlet means of the reactor, and has at least one outlet for a stream comprising an enriched concentration of solid components, preferably carbon black, compared to the mixture entering the at least one device for enrichment of solid components, preferably carbon black, and has at least one outlet for a stream comprising gaseous components of the mixture and a decreased concentration of solid components, preferably carbon black, compared to the mixture entering the at least one device for enrichment of solid components, preferably carbon black; and iv) at least one device for enrichment of hydrogen from the stream comprising gaseous components of the mixture and a decreased concentration of solid components, preferably carbon black, compared to the mixture entering the at least one device for enrichment of solid components, preferably carbon black, wherein the at least one device for enrichment of hydrogen is in fluid communication with the outlet for a stream comprising gaseous components of the mixture and a decreased concentration of solid components, preferably carbon black, of the at least one device for enrichment of solid components, preferably carbon black, of the mixture, and has at least one outlet for a stream comprising an enriched concentration of hydrogen, and preferably a reduced acetylene concentration, compared to the stream comprising gaseous components of the mixture and a decreased concentration of solid components, preferably carbon black, entering the at least one device for enrichment of hydrogen, and has at least one outlet for a stream comprising a reduced concentration of hydrogen compared to the stream comprising gaseous components of the mixture and a decreased concentration of solid components, preferably carbon black, entering the at least one device for enrichment of hydrogen, and comprising acetylene, preferably an enriched concentration of acetylene compared to the stream comprising gaseous components of the mixture and a decreased concentration of solid components, preferably carbon black, entering the at least one device for enrichment of hydrogen, wherein the stream or at least of portion of it is introduced into the at least one second feedline of the reactor for introducing a gas mixture comprising $C_1$- to $C_4$-alkane and acetylene into the first subsection of the second reactor section via an inlet in the at least one second feed line.

Embodiment 8: Device for the production of hydrogen and solid carbon from $C_1$- to $C_4$-alkane-containing gas by means of thermal plasma according to embodiment 7, wherein the device comprises a device to enrich the acetylene concentration of the stream comprising acetylene and a decreased concentration of hydrogen compared to the stream comprising gaseous components of the mixture and a decreased concentration of solid components, preferably carbon black, wherein this device has an inlet for acetylene-comprising gas which is in fluid communication with the outlet for a stream comprising acetylene and a decreased concentration of hydrogen compared to the stream comprising gaseous components of the mixture and a decreased concentration of solid components of the device for enrichment of hydrogen, and has an outlet for a stream with a reduced acetylene concentration relative to the stream entering the inlet of the device to enrich acetylene, and has an outlet for a stream with an enriched acetylene concentration relative to the stream entering the inlet, wherein the outlet is in fluid communication with the inlet of the at least one second feed line for introducing a gas mixture comprising $C_1$- to $C_4$-alkane and acetylene into the first subsection of the second reactor section.

Embodiment 9: Process for the production of hydrogen and solid carbon according to any one of embodiments 5 to 8, wherein the device further comprises the features of the device described in the appended claims and in the present description.

Embodiment 10: Use of a reactor as described in any of embodiments 5 to 9 in a process as described in any one of embodiments 1 to 4.

In some embodiments, there is also a storage tank for acetylene-containing gas from the stream comprising acetylene and a decreased concentration of hydrogen compared to the stream comprising gaseous components of the mixture and a decreased concentration of solid components, preferably carbon black.

Furthermore, the device may contain a control unit which controls the flow rate of the stream comprising acetylene and a decreased concentration of hydrogen compared to the stream comprising gaseous components of the mixture and a decreased concentration of solid components, preferably carbon black, into the inlet of the at least one second feed line for introducing a gas mixture comprising $C_1$- to $C_4$-alkane and acetylene into the first subsection of the second reactor section. In some embodiments, the control unit controls the flow rate depending on selected boundary conditions, e.g., the electricity price (if electricity is expensive, more acetylene is fed into the reactor), or on the process phase. E.g., in the start-up phase (when more energy is required to increase temperatures), a higher flow rate is selected. In other process phases, lower flow rates may be selected. If necessary, other parameters such as the flow rate of the $C_1$- to $C_4$-alkane-containing gas introduced into the first subsection of the second reactor section via the second feed line, the flow rate of the plasma gas, or specific electrical energy input are also adjusted accordingly. This applies also to the process of this aspect which may thus comprise the step of controlling the flow rate of the stream or part of the stream comprising acetylene and a decreased concentration of hydrogen compared to the stream comprising gaseous components of the mixture and a decreased concentration of solid components, preferably carbon black, into the inlet of the at least one second feed line for introducing a gas mixture comprising $C_1$- to $C_4$-alkane and acetylene into the first subsection of the second reactor section. This control of the flow rate is executed by the control unit describes above.

Devices for the enrichment of acetylene include for example, but are not limited to, an absorption column in which acetylene is washed out of the gas stream and a desorption column to recover the scrubbing medium and to release previously absorbed acetylene at higher concentration.

The independent aspect and the invention as defined in the appended claims are further illustrated in a non-limiting manner by the following examples and Figures.

Examples

The reference signs have the following meaning:
- 10: device of the invention
- 15: thermal plasma reactor
- 20: plasma section of the reactor
- 21: electric arc
- 22: part of the plasma section volume which begins at the most upstream position at which the inner surface of the hollow channel of the anode is facing the electric arc and reaches down to the end of the plasma section of the reactor and which defines the reference volume
- 23: flow direction of the main stream
- 24: gap in the flow direction of the main stream between the end of the cathode facing into the flow direction of the main stream (lower end of the cathode) and the end of the anode facing into the direction opposite to the flow direction of the main stream (upper end of the anode)
- 30: second reactor section
- 31: first subsection of the second reactor section
- 32: second subsection of the second reactor section
- 33: outlet means of the second reactor section
- 40: cathode (metal-based and water cooled)
- 50: anode (metal-based and water cooled)
- 60: first feed line
- 70: second feed line
- 71: most upstream point in the flow direction of the main stream at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode
- 72: inlet for line 144 connecting outlet 142 with the second feed line 70
- 80: third feed line
- 90: device for providing a $C_1$ to $C_4$-alkane-containing gas (natural gas supply)
- 100: electrical insulator
- 110: device for inducing swirling of the $C_1$- to $C_4$-alkane-containing plasma gas before its introduction into the plasma section
- 120: heat exchanger
- 130: device for enrichment of solid components, preferably carbon black
- 131: inlet of device 130
- 132: outlet for the stream with enriched concentration of solids, preferably carbon black
- 133: outlet for the stream with reduced concentration of solids, preferably carbon black
- 140: device for enrichment of hydrogen
- 141: inlet of device 140
- 142: outlet for the stream comprising acetylene and a reduced hydrogen concentration
- 143: outlet for the stream with enriched hydrogen concentration
- 144: line connecting the outlet for the stream with acetylene and a reduced hydrogen concentration with the second feed line 70
- 145: branch of line 144

The dotted arrows are intended to illustrate the flow of different gas flows. E.g., the arrow extending from feed line 60 illustrates the flow of the plasma gas to the gap (24) between the anode (50) and cathode (40). The same applies to the second (70) and third (80) feed lines and the corresponding dotted arrows. Dotted arrow (23) illustrates the flow of the main stream trough the reactor. As becomes apparent from FIGS. 1 and 2, the gas introduced via the second and third feed lined is injected transversely to the flow direction of the main stream.

FIG. 1 shows one embodiment of a device (10) of the present invention for the production of hydrogen and solid carbon from natural gas. The device (10) comprises a reactor (15) for generating thermal plasma by means of an electric arc. The device further comprises a device for providing a $C_1$- to $C_4$-alkane-containing gas (supply of natural gas) (90), a heat exchanger (120), a device for enrichment of solid components (130), and a device for enrichment of hydrogen (140). The means for supply of $C_1$- to $C_4$-alkane-containing gas (90), here natural gas, provides natural gas to the reactor. An exemplary natural gas composition has the following composition: Natural gas "H" (CIS states) consisting of about 98 vol. % methane, 1 vol. % further alkanes (ethane, propane, butane, pentane) and 1 vol. % inert gases.

The reactor (15) comprises a plasma section (20) and a second reactor section (30) directly following the plasma section of the reactor in the flow direction of the main stream (23). The plasma section (20) comprises an anode (50) and a cathode (40) for generating an electric arc (21), wherein the arc extends within the plasma section and is rotated around its axis by swirling of the $C_1$- to $C_4$-alkane-containing plasma gas induced by the device for inducing swirling of the $C_1$- to $C_4$-alkane-containing plasma gas before its introduction into the plasma section 110. Furthermore, the plasma section comprises at least one first feed line (60) for introducing a $C_1$- to $C_4$-alkane-containing plasma gas into the plasma section of the reactor. The cathode (40) is cylindrical and has a hollow channel with the main axis extending along the flow direction of the main stream (23) in the plasma section.

The anode (50) is cylindrical and has a hollow channel along the flow direction of the main stream of the plasma gas. The hollow channel has an inner surface. Furthermore, the channel has an outlet in the flow direction of the main stream of the plasma gas which forms the open end of the anode in the flow direction of the main stream. And the channel has at least one inlet for receiving the $C_1$- to $C_4$-alkane-containing plasma gas (here natural gas) introduced into the plasma section of the reactor via the at least one first feed line which forms the open end of the anode facing into the direction opposite to the flow direction to the main stream. The anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode on its passage through the anode.

The anode and cathode are concentric. The hollow channel of the cathode has two opposing ends, wherein the end facing into the direction opposite to the flow direction of the main stream is closed and wherein the end facing into the flow direction of the main stream of the plasma gas is open and positioned upstream and concentric to the open end of the anode facing into the direction opposite to the flow direction of the main stream. The cathode is positioned upstream of the open end of the anode facing into the direction opposite to the flow direction of the main stream, wherein the anode and cathode are arranged such that the foot points of the electric arc (21) contact the inner surface of the hollow channel of the anode and the inner surface of the cathode, respectively. Thereby, the generated electric arc is formed in said plasma section to form a plasmaeous plasma gas in said plasma section from the $C_1$- to $C_4$-alkane-containing plasma gas introduced into said plasma section through said at least one first feed line. As shown in FIG. 1, the anode and the cathode are arranged such that there is a gap (24) in the direction of the main stream between the end of the cathode facing into the flow direction of the main stream (lower end of the cathode) and the end of the anode facing into the direction opposite to the flow direction of the main stream (upper end of the anode). The length of said gap (24) is larger than preferably at least 0.3, more preferably at least 0.5, times the average inner diameter of the hollow channel of the anode in the range of the foot points of the electric arc on the inner surface of the hollow channel of the anode. Accordingly, the anode and cathode are not nested (i.e., at least partially overlapping). The at least one first feed line is arranged such that the introduction of the plasma gas into the plasma section of the reactor via the device for inducing swirling of the $C_1$- to $C_4$-alkane-containing plasma gas before its introduction into the plasma section (110) is fed through the vertical gap between the anode and cathode into the volumes of the hollow cathode and anode.

The second reactor section (30) comprises a first subsection (31) and a second subsection (32), wherein the second subsection is directly downstream of the first subsection in the flow direction of the main stream. Furthermore, the second reactor section comprises outlet means (33) for withdrawing components from the reactor, wherein the outlet means are located at the end of the second reactor section in the flow direction of the main stream. The first subsection comprises at least one second feed line (70) for introducing a $C_1$- to $C_4$-alkane-containing gas into the second reactor section, wherein the at least one second feed line is arranged such that the $C_1$- to $C_4$-alkane-containing gas, which is introduced into the reactor via the at least one second feed line, is transversely to the flow direction of the main stream introduced into the plasmaeous plasma gas at a position downstream of the foot points of the electric arc in the flow direction of the main stream. So, a mixture is formed in the first subsection of the second reactor section from the plasmaeous plasma gas leaving the plasma section and the $C_1$- to $C_4$-alkane-containing gas of the at least one second feed line. In addition, the first subsection of the second reactor section comprises at least at one point a flow cross-section transverse to the flow direction of the main stream which is greater by at least a factor of 5, preferably by at least a factor of 10, in comparison with the average flow cross-section of the anode transverse to the flow direction of the main stream in the range of the foot points of the electric arc on the inner surface of the hollow channel of the anode.

Directly upstream of point (71), there is a sudden expansion of the flow cross-section transverse to the flow direction of the main stream which has an opening angle of about 90° relative to the flow direction of the main stream. The flow cross-section transverse to the flow direction of the main stream in the range of the foot points of the electric arc on the inner surface of the hollow channel of the anode down to the expansion directly upstream of point (71) essentially stays the same. The sudden expansion results in defined backmixing and vortices of the components on their flow through the second reactor section, especially right behind the sudden expansion. As a result thereof, the residence time distribution of the atoms of the mixture resulting from the plasmaeous plasma gas leaving the plasma section and the $C_1$- to $C_4$-alkane-containing gas of at least one second feed line is broadened. At least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section, wherein preferably at least 10% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 10% from the mean residence time of all atoms of the mixture resulting from the plasmaeous plasma gas leaving the plasma section and the $C_1$- to $C_4$-alkane-containing gas of the at least one second feed line in the second reactor section, more preferred by at least 15%, even more preferred by at least 20%, from the mean residence time of all atoms of the mixture resulting from the plasmaeous plasma gas leaving the plasma section and the $C_1$- to $C_4$-alkane-containing gas of the at least one second feed line in the second reactor section.

In FIG. 1, the at least one second feed line (70) is in the flow direction of the main stream upstream of the most upstream point in the flow direction of the main stream at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode (71). The at least one second feed line (70) defines the beginning of the second reactor section (30) and of its first subsection (31).

The volume of the plasma section which begins at the most upstream position at which the inner surface of the hollow channel of the anode (50) is facing the electric arc (21) and reaches down to the end of the plasma section of the reactor has a volume in the range of 0.0001 m$^3$ to 0.4 m$^3$, preferably in the range of 0.001 to 0.2 m$^3$, and defines a reference volume (22). The volume of the first subsection (31) of the second reactor section is in the range of 10 to 200 times the reference volume, preferably in the range of 20 to 100 times the reference volume. The volume of the total second reactor section is in the range of 20 to 2000 times the reference volume, preferably in the range of 40 to 1000 times the reference volume. The second reactor section is configured such that the plasmaeous plasma gas at the position at which the $C_1$- to $C_4$-alkane-containing gas of the at least one second feed line is introduced into the plasmaeous plasma gas has a mean temperature in the range of 1200 to 3000° C., preferably in the range of 1500 to 3000° C., and comprises acetylene, and wherein the mixture resulting from the introduction of the $C_1$- to $C_4$-alkane-containing gas via the at least one second feed line into the plasmaeous plasma gas has in the range from the at least one second feed line down to the end of the first subsection of the second reactor section a mean temperature of at least 850° C., preferably at least 1050° C., and less than 3000° C.

Furthermore, the second reactor section is configured such that in the second subsection of the second reactor section the mean temperature of the mixture resulting from the mixture of the plasmaeous plasma gas and the $C_1$- to $C_4$-alkane-containing gas introduced via the at least second feed line and their reactions at any point along the flow direction of the main stream is at least 650° C., preferably at least 750° C., more preferably to at least 850° C. and to less than 1500° C., wherein the mean temperature of the mixture resulting from the mixture of the plasmaeous plasma gas and the $C_1$- to $C_4$-alkane-containing gas introduced via the at least second feed line and their reactions is at the end of the second reactor section at least 200 K, preferably at least 400 K, more preferably at least 600 K, lower than the mean temperature of the plasmaeous plasma gas at the position at which the $C_1$- to $C_4$-alkane-containing gas is introduced into the plasmaeous plasma gas via the at least one second feed line.

In this example, the reactor (15) comprises at least one third feed line (80) to introduce further $C_1$- to $C_4$-alkane-containing gas (natural gas) into the mixture. This cascade-like arrangement of the second and third feedline improves the control of the temperature along the path of the main flow.

Finally, the mixture is withdrawn from the reactor (15) via the outlet means (33). The mixture withdrawn from the reactor via outlet means (33) comprises acetylene in the range of 0.01 to 4 vol. %, preferably in the range of 0.1 to 1 vol. %. In this embodiment, the outlet means of the reactor (33) is connected with a heat exchanger (120) which is used to pre-heat the gas entering the reactor via feed lines (60), (70), and (80). Pre-heating of the gas introduced into the reactor reduces the overall electrical energy expenses and improves the production capacity of the reactor.

The mixture withdrawn via the outlet means (33) and passed through heat exchanger (120) is introduced into a device for enrichment of solid components of the mixture (130), preferably carbon black, via inlet (131). Device (130) may be a high temperature cyclone. This device separates gaseous components from solid components of the mixture to enrich solid components of the mixture. The device (130) is in fluid communication with the outlet means (33) of the reactor. Device (130) has an outlet (132) to release a stream comprising an enriched concentration of solid components, preferably carbon black, compared to the mixture entering the device for enrichment of solid components, preferably carbon black, and an outlet (133) for a stream comprising gaseous components of the mixture and a decreased concentration of solid components, preferably carbon black, compared to the mixture entering the device for enrichment of solid components, preferably carbon black. At least a portion of the solid carbon produced in the reactor, preferably carbon black, is removed together with the stream comprising an enriched concentration of solid components, preferably carbon black, compared to the mixture entering the device for enrichment of solid components, preferably carbon black, via outlet (132).

Outlet (133) is in fluid communication with a device (140) for enrichment of hydrogen from the stream comprising gaseous components of the mixture and a decreased concentration of solid components, preferably carbon black. This device enriches the hydrogen content of the stream entering the device via inlet (141). Further, the device has an outlet (143) for a stream comprising an enriched concentration of hydrogen and an outlet (142) for a stream comprising a decreased concentration of hydrogen compared to the stream comprising gaseous components of the mixture and a decreased concentration of solid components, preferably carbon black, entering the device for enrichment of hydrogen. The stream withdrawn at outlet (143) may be fed into a hydrogen storage container (not shown). The stream leaving outlet (142) comprises an increased acetylene concentration compared to the stream withdrawn at outlet (143) and is fed via line (144) into the at least one second feed line (70). The stream withdrawn at outlet (143) may be fed into a storage container (not shown). The acetylene fed into the first subsection of the second reactor section enables faster heating of the $C_1$- to $C_4$-alkane-containing gas introduced into the second reactor section by the at least one second feed line by heat release due to acetylene decomposition. Also, the overall electric energy consumption can be reduced.

As can be seen in FIG. 1, the reactor does not comprise means for quenching the mixture by feeding in a liquid medium into the second reactor section. Avoiding quenching in the second reactor section and withdrawing the mixture at correspondingly higher temperature enables more efficient preheating of the feed gas and allows improving the overall energy balance of the hydrogen and solid carbon production.

FIG. 2 shows an alternative embodiment of the present invention. This differs from the embodiment shown in FIG. 1 in that upstream of the beginning of the second reactor section there is the most upstream point in the flow direction of the main stream at which the flow cross-section transverse to the flow direction of the main stream is greater by at least a factor of 5, preferably by at least a factor of 10, in comparison with the average flow cross-section of the anode transverse to the flow direction of the main stream in the range of the foot points of the electric arc on the inner surface of the hollow channel of the anode (71).

The process of the present invention for the production of hydrogen and solid carbon from $C_1$- to $C_4$-alkane-containing gas by means of thermal plasma can be put into practice using the above-described devices (10). The process comprises the steps:

a) withdrawing a $C_1$- to $C_4$-alkane-containing plasma gas from a device for providing a $C_1$- to $C_4$-alkane-containing gas (90); and b) introducing the $C_1$- to $C_4$-alkane-containing plasma gas withdrawn from the device (90) for withdrawing a $C_1$- to $C_4$-alkane-containing plasma gas into at least a first reactor (15), wherein said reactor is a reactor for generating a thermal plasma by means of an electric arc (21), wherein the $C_1$- to $C_4$-alkane-containing plasma gas is introduced into the reactor via the at least one first feed line (60) for introducing a $C_1$- to $C_4$-alkane-containing plasma gas into the plasma section (20) of the reactor (15); and c) generating an electric arc (21) with the anode (50) and cathode (40) extending within the plasma section (20) of the reactor, wherein the foot points of the electric arc contact the inner surface of the hollow channel of the anode and the inner surface of the hollow channel of the cathode, respectively, and wherein the electric arc is rotated around an axis stretching from the cathode to the anode. The electric arc rotation is caused by means of a device (110) for inducing swirling of the $C_1$- to $C_4$-alkane-containing plasma gas before its introduction into the plasma section via the at least one first feed line (60). The rotation axis of the electric arc is oriented in the flow direction of the main stream (23). The rotation frequency of the electric arc around its axis is at least $0.1\ s^{-1}$, more preferably at least $0.2\ s^{-1}$, even more preferably at least $0.5\ s^{-1}$; and d) forming a plasmaeous plasma gas in the plasma section (20) of the reactor by means of the electric arc (21) from the $C_1$- to $C_4$-alkane-containing plasma gas introduced into the plasma section via the at least one first feed line (60) for introducing a $C_1$- to $C_4$-alkane-containing plasma gas into the plasma section (20); and e) introducing a $C_1$- to $C_4$-alkane-containing gas into the first subsection (31) of the second reactor section (30) via the at least one second feed line (70) for introducing a $C_1$- to $C_4$-alkane-containing gas into the second reactor section, wherein the position of the at least one second feed line along the flow direction of the main stream defines the beginning of the second reactor section and of its first subsection, wherein the introduction is carried out in such a way that the $C_1$- to $C_4$-alkane-containing gas, which is introduced into the second reactor section via the at least one second feed line, is introduced transversely into the plasmaeous plasma gas in the flow direction of the main stream (23) downstream of the foot points of the electric arc (21) produced by the anode and cathode, so that in the first subsection of the second reactor section downstream of the at least one second feed line a mixture is formed from the plasmaeous plasma gas leaving the plasma section and the $C_1$- to $C_4$-alkane-containing gas which is introduced into the first subsection of the second reactor section via the at least one second feed line (70), wherein the plasmaeous plasma gas at the position at which the $C_1$- to $C_4$-alkane-containing gas is introduced into the plasmaeous plasma gas via the at least one second feed line (70) has a mean temperature in the range of 1200 to 3000° C. and comprises acetylene, thereby forming a mixture resulting from the introduction of the $C_1$- to $C_4$-alkane-containing gas via the at least one second feed line into the plasmaeous plasma gas which has in the range from the at least one second feed line (70) down to the end of the first subsection of the second reactor section a mean temperature of at least 850° C., preferably of at least 1050° C., and less than 3000° C.; and f) passing the mixture downstream through the second reactor section in the flow direction of the main stream (23), wherein said passing is such that in the first subsection (31) of the second reactor section the mean residence time of the atoms of the mixture resulting from the plasmaeous plasma gas leaving the plasma section and the $C_1$- to $C_4$-alkane-containing gas of the at least one second feed line is in the range of 100 ms to 2000 ms, preferably in the range of 200 ms to 1000 ms, and the passing is such that in the total second reactor section (30) the mean residence time of the atoms of the mixture resulting from the plasmaeous plasma gas leaving the plasma section and the $C_1$- to $C_4$-alkane-containing gas of the at least one second feed line is in the range of 200 ms to 20000 ms, preferably in the range of 400 ms to 10000 ms, and at least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section, wherein preferably at least 10% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 10% from the mean residence time of all atoms of the mixture resulting from the plasmaeous plasma gas leaving the plasma section and the $C_1$- to $C_4$-alkane-containing gas of the at least one second feed line in the second reactor section, more preferred by at least 15%, even more preferred by at least 20%, from the mean residence time of all atoms of the mixture resulting from the plasmaeous plasma gas leaving the plasma section and the $C_1$- to $C_4$-alkane-containing gas of the at least one second feed line in the second reactor section, and hydrogen is produced by the reactions taking place in the mixture in the second reactor section, and preferably also in the plasma section; and g) adjusting the mean temperature of the mixture in the second subsection of the second reactor section to at least 650° C., preferably to at least 750° C., more preferably to at least 850° C. and to less than 1500° C., wherein the mean temperature of the mixture of the plasmaeous plasma gas and the $C_1$- to $C_4$-alkane-containing gas introduced via the at least second feed line at the end of the second reactor section is adjusted to a mean temperature which is at least 200 K, preferably at least 400 K, more preferably at least 600 K, lower than the mean temperature of the plasmaeous plasma gas at the position at which the $C_1$- to $C_4$-alkane-containing gas is introduced into the plasmaeous plasma gas via the at least one second feed line; and h) withdrawing the mixture at the end of the reactor via outlet means (33) for withdrawing the mixture from the reactor, wherein the outlet means (33) are located at the end of the second reactor section in the flow direction of the main stream, passing the mixture though a heat exchanger (120); and i) treating the mixture leaving the heat exchanger (120) with a device (130) for the enrichment of solid components, especially of carbon black, of the mixture to produce a stream comprising an enriched concentration of the solid components, especially of carbon black, of the mixture and a stream comprising gaseous components of the mixture and a decreased concentration of solid components, especially carbon black, of the mixture; and j) treating the stream comprising gaseous components of the mixture and a decreased concentration of solid components, preferably carbon black, of the mixture with a device (140) to produce a stream having an enriched concentration of hydrogen withdrawn at outlet (143) compared to the stream comprising gaseous components of the mixture and a decreased concentration of solid components, preferably carbon black, of the mixture, and a stream withdrawn at outlet (142) comprising a reduced concentration of hydrogen compared to the stream comprising gaseous components of the mixture and a decreased concentration of solid components, preferably carbon black, of the mixture. Stream (142) comprises an enriched concentration of acetylene relative to stream (143).

The heat exchanger (120) is used to heat the stream from device (90) before entering the reactor via inlets (60), (70), and (80). Device (130) is used to enrich the solid carbon, preferably carbon black, resulting from the reactions in the reactor. Furthermore, device (140) is used to enrich hydrogen from mixture. The stream comprising an enriched hydrogen concentration may be withdrawn from outlet (143) and fed into a storage container. The stream comprising a reduced concentration of hydrogen compared to the stream comprising gaseous components of the mixture and a decreased concentration of solid components of the mixture and withdrawn at outlet (142) comprises acetylene, preferably comprises an increased concentration of acetylene relative to the stream entering inlet (141). Stream withdrawn via outlet (142) comprising acetylene may be fed via line (144) into the inlet (72) of the at least one second feed line (70). In a further preferred embodiment, the stream withdrawn at outlet (142) is fed via line (144) into a device for enrichment of the acetylene concentration (not shown here) which is in fluid communication with inlet (72). The device for enrichment of the acetylene concentration has an outlet for a stream comprising an increased concentration of acetylene relative to the feed stream of the device which is in fluid communication with inlet (72). This stream may be fed into the at least one second feed line (70) via inlet (72).

In a further embodiment of the device and process described herein, an additional heat exchanger (neither shown in FIG. 1 nor in FIG. 2) is placed between the heat exchanger (120) and the separating device (130) and used for steam generation.

In certain embodiments, heat exchanger (120) is connected such that it transfers heat from the mixture withdrawn via outlet (33) to the stream passed via line (144) to inlet (72) in order to pre-heat the stream prior to its injection into the stream introduced into the first subsection of the second reactor section via the at least one second feed line (70).

Also, the above-described device can be used for the process of the present invention, in particular the process of the above-described process.

The invention claimed is:

1. A device for producing hydrogen and solid carbon from $C_1$- to $C_4$-alkane-containing gas by means of thermal plasma, said device comprising:

at least one reactor for generating a thermal plasma by means of an electric arc, the reactor comprising:

i) a plasma section comprising
an anode and a cathode for generating an electric arc, the arc extending within the plasma section, and
at least one first feed line for introducing a $C_1$- to $C_4$-alkane-containing plasma gas into the plasma section of the reactor,
wherein the anode has a hollow channel along a flow direction of a main stream of the plasma gas which has an inner surface, an outlet in the flow direction of the main stream of the plasma gas which forms an open end of the anode in the flow direction of the main stream, and at least one inlet for receiving the $C_1$- to $C_4$-alkane-containing plasma gas introduced into the plasma section of the reactor via the at least one first feed line, wherein the at least one inlet forms an open end of the anode facing into the direction opposite to the flow direction of the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode during passage through the anode, and
wherein said anode and said cathode are arranged so that the arc generated by said anode and cathode is formed in said plasma section to form a plasmaeous plasma gas in said plasma section from the $C_1$- to $C_4$-alkane-containing plasma gas introduced into said plasma section through said at least one first feed line, and
wherein foot points of the electric arc contacting the anode are located on the inner surface of the hollow channel of the anode, and ii) a second reactor section directly downstream of the plasma section of the reactor in the flow direction of the main stream, the second reactor section comprising
a first subsection and a second subsection, wherein the second subsection is directly downstream of the first subsection in the flow direction of the main stream, and
outlet means for withdrawing components from the reactor, wherein the outlet means are located at the end of the second reactor section in the flow direction of the main stream, wherein
the first subsection comprises at least one second feed line for introducing a $C_1$- to $C_4$-alkane-containing gas into the second reactor section, wherein
the at least one second feed line is arranged such that the $C_1$- to $C_4$-alkane-containing gas which is introduced into the reactor via the at least one second feed line is introduced into the plasmaeous plasma gas at a position downstream of the foot points of the electric arc in the flow direction of the main stream, so that in the first subsection of the second reactor section downstream of the at least one second feed line a mixture is formed from the plasmaeous plasma gas leaving the plasma section and the $C_1$- to $C_4$-alkane-containing gas of the at least one second feed line, and
wherein the position of the at least one second feed line along the flow direction of the main stream defines a beginning of the second reactor section and of its first subsection, and wherein the plasma section has a volume which begins at the most upstream position at which the inner surface of the hollow channel of the anode is facing the electric arc and reaches down to the end of the plasma section of the reactor, wherein the plasma section volume is in the range of 0.0001 $m^3$ to 0.4 $m^3$, and defines a reference volume, and wherein the first subsection of the second reactor section has a volume in the range of 10 to 200 times the reference volume, and wherein the total second reactor section has a volume in the range of 20 to 2000 times the reference volume, and wherein the reactor comprises in the first subsection of the second reactor section and/or in the plasma section in the range downstream in the flow direction of the main stream of the foot points of the electric arc on the inner surface of the hollow channel of the anode down to the end of the plasma section at least at one point a flow cross-section transverse to the flow direction of the main stream which is greater by at least a factor of 5, in comparison with the average flow cross-section of the anode transverse to the flow direction of the main stream in the range of the foot points of the electric arc on the inner surface of the hollow channel of the anode.

2. The device for producing hydrogen and solid carbon according to claim 1, wherein the device further comprises:

at least one device for enrichment of solid components, formed in said reactor, wherein said at least one device for enrichment of solid components, separates gaseous components from solid components, of the mixture to enrich the solid components, of the mixture, wherein the at least one device for enrichment of solid components, is in fluid communication with the outlet means of the reactor, and has at least one outlet for a stream comprising an enriched concentration of solid components, compared to the mixture entering the at least one device for enrichment of solid components, and has at least one outlet for a stream comprising gaseous components of the mixture and a decreased concentration of solid components, compared to the mixture entering the at least one device for enrichment of solid components.

3. The device for producing hydrogen and solid carbon according to claim 2, wherein the device further comprises:

at least one device for enrichment of hydrogen from the stream comprising gaseous components of the mixture and a decreased concentration of solid components, compared to the mixture entering the at least one device for enrichment of solid components, wherein the at least one device for enrichment of hydrogen is in fluid communication with the outlet for a stream comprising gaseous components of the mixture and a decreased concentration of solid components, of the at least one device for enrichment of solid components, of the mixture, and has at least one outlet for a stream comprising an enriched concentration of hydrogen compared to the stream comprising gaseous components of the mixture and a decreased concentration of solid components, entering the at least one device for enrichment of hydrogen, and has at least one outlet for a stream comprising a decreased concentration of hydrogen compared to the stream comprising gaseous components of the mixture and a decreased concentration of solid components, entering the at least one device for enrichment of hydrogen.

4. The device for producing hydrogen and solid carbon according to claim 1, wherein between the foot points of the electric arc on the inner surface of the hollow channel of the anode and the most upstream point in the flow direction of the main stream at which the flow cross-section transverse to the flow direction of the main stream is greater by at least a factor of 5, in comparison with the average flow cross-section of the anode transverse to the flow direction of the main stream in the range of the foot points of the electric arc on the inner surface of the hollow channel of the anode, there is at least one sudden expansion of the flow cross-section transverse to the flow direction of the main stream which has an opening angle of at least 20°, into the flow direction of the main stream relative to the main stream axis; and/or the flow cross-section transverse to the flow direction of the main stream in the range from the foot points of the electric arc on the inner surface of the hollow channel of the anode down to the most upstream point in the flow direction of the main stream at which the flow cross-section transverse to the flow direction of the main stream is greater by at least a factor of 5, in comparison with the average flow cross-section of the anode transverse to the flow direction of the main stream in the range of the foot points of the electric arc on the inner surface of the hollow channel of the anode is at any point at least 60%, relative to the average flow cross-section transverse to the flow direction of the main stream at the foot points of the electric arc on the inner surface of the hollow channel of the anode.

5. The device for producing hydrogen and solid carbon according to claim 1, wherein the reactor comprises means to detachably connect the anode or a portion of the anode with the rest of the reactor, and/or the corresponding anode and cathode do not at least partially overlap in the flow direction of the main stream; and/or the anode and/or cathode are cooled electrodes.

6. The device for producing hydrogen and solid carbon according to claim 1, wherein the anode and cathode are concentric, and the cathode has a hollow channel with the main axis extending along the flow direction of the main stream, wherein the hollow channel has two opposing ends, wherein the end facing into the direction opposite to the flow direction of the main stream is closed and wherein the end facing into the flow direction of the main stream of the plasma gas is open and positioned upstream and concentric to the open end of the anode facing into the direction opposite to the flow direction of the main stream, wherein the anode and cathode are arranged such that the foot points of the electric arc contact the inner surface of the hollow channel of the cathode and the inner surface of the hollow channel of the anode, respectively.

7. The device for producing hydrogen and solid carbon according to claim 1, wherein the at least one reactor is configured such that the at least one second feed line introduces the $C_1$- to $C_4$-alkanecontaining gas into the plasmaeous plasma gas transversely to the flow direction of the main stream; and/or the at least one reactor has at least one third feed line for introducing $C_1$- to $C_4$-alkane-containing gas into the second reactor section, the at least one third feed line for introducing $C_1$- to $C_4$-alkane-containing gas being arranged in the flow direction of the main stream downstream of the at least one second feed line for introducing a $C_1$- to $C_4$-alkane-containing gas into the second reactor section; and/or the second reactor section comprises at least one device for inducing turbulence and/or backmixing of the mixture.

8. The device for producing hydrogen and solid carbon according to claim 1, wherein at least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section.

9. A process for the production of hydrogen and solid carbon from $C_1$- to $C_4$-alkane-containing gas by means of thermal plasma, wherein the process comprises the steps of:

a) withdrawing a $C_1$- to $C_4$-alkane-containing plasma gas from a device for providing a $C_1$- to $C_4$-alkane-containing gas;

b) introducing the $C_1$- to $C_4$-alkane-containing plasma gas withdrawn from the device for providing a $C_1$- to $C_4$-alkane-containing plasma gas into at least a first reactor;

wherein said reactor is a reactor for generating a thermal plasma by means of an electric arc, said reactor comprising i) a plasma section comprising an anode and a cathode for generating an electric arc, the arc extending within the plasma section, and at least one first feed line for introducing a $C_1$- to $C_4$-alkane-containing plasma gas into the plasma section of the reactor, wherein the anode has a hollow channel along a flow direction of a main stream of the plasma gas which has an inner surface, an outlet in the flow direction of the main stream of the plasma gas which forms an open end of the anode in the flow direction of the main stream, and at least one inlet for receiving the $C_1$- to $C_4$-alkane-containing plasma gas introduced into the plasma section of the reactor via the at least one first feed line, wherein the at least one inlet forms an open end of the anode facing into the direction opposite to the flow direction to the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode during passage through the anode, and wherein said anode and said cathode are arranged so that the arc generated by said anode and cathode is formed in said plasma section to form a plasmaeous plasma gas in said plasma section from the $C_1$- to $C_4$-alkane-containing plasma gas introduced into said plasma section through said at least one first feed line, and wherein foot points of the electric arc contacting the anode are located on the inner surface of the hollow channel of the anode, and ii) a second reactor section directly downstream of the plasma section of the reactor in the flow direction of the main stream, the second reactor section comprising a first subsection and a second subsection, wherein the second subsection is directly downstream of the first subsection in the flow direction of the main stream, and outlet means for withdrawing components from the reactor, wherein the outlet means are located at the end of the second reactor section in the flow direction of the main stream, and the first subsection comprises at least one second feed line for introducing a $C_1$- to $C_4$-alkane-containing gas into the second reactor section, wherein the position of the at least one second feed line along the flow direction of the main stream defines a beginning of the second reactor section and of its first subsection, and wherein the $C_1$- to $C_4$-alkane-containing plasma gas is introduced into the reactor via the at least one first feed line for introducing a $C_1$- to $C_4$-alkane-containing plasma gas into the plasma section of the reactor;

c) generating an electric arc with the anode and cathode extending within the plasma section of the reactor;

d) forming a plasmaeous plasma gas in the plasma section of the reactor by means of the electric arc from the $C_1$- to $C_4$-alkane-containing plasma gas introduced into the plasma section via the at least one first feed line for introducing a $C_1$- to $C_4$-alkane-containing plasma gas into the plasma section;

e) introducing a $C_1$- to $C_4$-alkane-containing gas into the first subsection of the second reactor section via the at least one second feed line for introducing a $C_1$- to $C_4$-alkane-containing gas into the second reactor section, wherein the introduction is carried out in such a way that the $C_1$- to $C_4$-alkane-containing gas, which is introduced into the second reactor section via the at least one second feed line, is introduced into the plasmaeous plasma gas in the flow direction of the main stream downstream of the foot points of the electric arc produced by the anode and cathode, so that in the first subsection of the second reactor section downstream of the at least one second feed line a mixture is formed from the plasmaeous plasma gas leaving the plasma section and the $C_1$- to $C_4$-alkane-containing gas which is introduced into the first subsection of the second reactor section via the at least one second feed line, wherein the plasmaeous plasma gas at the position at which the $C_1$- to $C_4$-alkane-containing gas is introduced into the plasmaeous plasma gas via the at least one second feed line has a mean temperature in the range of 1200 to 3000° C. and comprises acetylene, thereby forming a mixture resulting from the introduction of the $C_1$- to $C_4$-alkane-containing gas via the at least one second feed line into the plasmaeous plasma gas which has in the range from the at least one second feed line down to the end of the first subsection of the second reactor section a mean temperature of at least 850° C., and less than 3000° C.;

f) passing the mixture downstream through the second reactor section in the flow direction of the main stream, wherein said passing is such that in the first subsection of the second reactor section the mean residence time of the atoms of the mixture resulting from the plasmaeous plasma gas leaving the plasma section and the $C_1$- to $C_4$-alkane-containing gas of the at least one second feed line is in the range of 100 ms to 2000 ms, and the passing is such that in the total second reactor section the mean residence time of the atoms of the mixture resulting from the plasmaeous plasma gas leaving the plasma section and the $C_1$- to $C_4$-alkane-containing gas of the at least one second feed line is in the range of 200 ms to 20000 ms, and at least 5% of the atoms of the mixture resulting from the plasmaeous plasma gas leaving the plasma section and the $C_1$- to $C_4$-alkane-containing gas of the at least one second feed line have a residence time in the second reactor section which deviates in absolute numbers by at least 5% from the mean residence time of all atoms of the mixture resulting from the plasmaeous plasma gas leaving the plasma section and the $C_1$- to $C_4$-alkane-containing gas of the at least one second feed line in the second reactor section, and hydrogen and solid carbon are produced by the reactions taking place in the mixture in the second reactor section;

g) adjusting the mean temperature of the mixture in the second subsection of the second reactor section to at least 650° C., wherein the mean temperature of the mixture of the plasmaeous plasma gas and the $C_1$- to $C_4$-alkane-containing gas introduced via the at least second feed line at the end of the second reactor section is adjusted to a mean temperature which is at least 200 K lower than the mean temperature of the plasmaeous plasma gas at the position at which the $C_1$- to $C_4$-alkane-containing gas is introduced into the plasmaeous plasma gas via the at least one second feed line; and h) withdrawing the mixture at the end of the reactor via outlet means for withdrawing the mixture from the reactor, wherein the outlet means are located at the end of the second reactor section in the flow direction of the main stream.

10. The process according to claim 9, wherein the process further comprises the step i) treating the mixture withdrawn via the outlet means with at least one device for enrichment of solid components of the mixture, to produce a stream comprising an enriched concentration of the solid components of the mixture, and a stream comprising gaseous components of the mixture and a decreased concentration of solid components of the mixture; wherein step i) is carried out in at least one device for enrichment of solid components, formed in the reactor, wherein said at least one device for enrichment of solid components, is used to separate gaseous components from solid components, of the mixture to enrich the solid components of the mixture, wherein the at least one device for enrichment of solid components is in fluid communication with the outlet means of the reactor, and has at least one outlet for a stream comprising an enriched concentration of solid components, compared to the mixture entering the at least one device for enrichment of solid components, and has at least one outlet for a stream comprising gaseous components of the mixture and a decreased concentration of solid components, compared to the mixture entering the at least one device for enrichment of solid components; and/or the mean residence time of the atoms of the mixture resulting from the plasmaeous plasma gas leaving the plasma section and the $C_1$- to $C_4$-alkane-containing gas of the at least one second feed line in the range from the beginning of the second reactor section down to and including the device for enrichment of solid components, mixture is in the range of 200 ms to 20000 ms.

11. The process according to claim 10, wherein the process further comprises the step j) treating the stream comprising gaseous components of the mixture and a decreased concentration of solid components of the mixture, with at least one device to produce a stream having an enriched concentration of hydrogen compared to the stream comprising gaseous components of the mixture and a decreased concentration of solid components of the mixture, wherein step j) is carried out in at least one device for enrichment of hydrogen from the stream comprising gaseous components of the mixture and a decreased concentration of solid components, compared to the mixture entering the at least one device for enrichment of solid components, wherein the at least one device for enrichment of hydrogen is in fluid communication with at least one outlet for a stream comprising a decreased concentration of solid components, of the at least one device for enrichment of solid components, of the mixture, and has at least one outlet for a stream comprising an enriched concentration of hydrogen compared to the stream comprising gaseous components of the mixture and a decreased concentration of solid components, entering the at least one device for enrichment of hydrogen, and has at least one outlet for a stream comprising gaseous components of the mixture and a decreased concentration of hydrogen compared to the stream comprising a decreased concentration of solid components, entering the at least one device for enrichment of hydrogen.

12. The process according to claim 9, wherein the reactor comprises in the first subsection of the second reactor section and/or in the plasma section in the range downstream in the flow direction of the main stream of the foot points of the electric arc on the inner surface of the hollow channel of the anode down to the end of the plasma section, at least at one point a flow cross-section transverse to the flow direction of the main stream is greater by at least a factor of 5, in comparison with the average flow cross-section of the anode transverse to the flow direction of the main stream in the range of the foot points of the electric arc on the inner surface of the hollow channel of the anode.

13. The process according to claim 9, wherein
the $C_1$- to $C_4$-alkane-containing gas is introduced via the at least one second feed line into the plasmaeous plasma gas transversely to the flow direction of the main stream; and/or
at least a third introduction of $C_1$- to $C_4$-alkane-containing gas into the second reactor section is carried out, the third introduction being carried out via an at least one third feed line which is arranged in the flow direction of the main stream downstream of the at least one second feed line for the introduction of $C_1$- to $C_4$-alkane-containing gas into the second reactor section.

14. The process according to claim 9, wherein
solid carbon, dispersed in a hydrogen and/or $C_1$- to $C_4$-alkane-containing gas is introduced into the second reactor section, either directly or, by introduction into the at least one second feed line for introducing a $C_1$- to $C_4$-alkane-containing gas into the first subsection of the second reactor section, the solid carbon, containing gas stream right before the point of introduction into the second reactor section or right before the point of introduction into the at least one second feed line for introducing a $C_1$- to $C_4$-alkane-containing gas into the first subsection of the second reactor section, respectively; and/or
the plasmaeous plasma gas at the position at which the $C_1$- to $C_4$-alkane-containing gas is introduced into the plasmaeous plasma gas via the at least one second feed line comprises at least 2 vol. % acetylene; and/or
the electric arc generated by the anode and cathode is rotated around an axis stretching from the cathode to the anode.

15. The process according to claim 9, wherein
additional turbulence and/or backmixing in the mixture is induced in the second reactor section.

16. The process according to claim 9, wherein
the anode and cathode of the at least first reactor are concentric, and the cathode has a hollow channel with the main axis extending along the flow direction of the main stream, wherein the hollow channel has two opposing ends, wherein the end facing into the direction opposite to the flow direction of the main stream is closed and wherein the end facing into the flow direction of the main stream of the plasma gas is open and positioned upstream and concentric to the open end of the anode facing into the direction opposite to the flow direction of the main stream, wherein the anode and cathode are arranged such that the foot points of the electric arc contact the inner surface of the hollow channel of the anode and the inner surface of the hollow channel of the cathode, respectively; and/or
the $C_1$- to $C_4$-alkane-containing gas of the plasma gas and/or the at least one second feed line is natural gas or is a gas comprising methane.

17. The process according to claim 9, wherein the device comprises:
at least one reactor for generating a thermal plasma by means of an electric arc, the reactor comprising
i) a plasma section comprising
an anode and a cathode for generating an electric arc, the arc extending within the plasma section, and
at least one first feed line for introducing a $C_1$- to $C_4$-alkane-containing plasma gas into the plasma section of the reactor,
wherein the anode has a hollow channel along a flow direction of a main stream of the plasma gas which has an inner surface, an outlet in the flow direction of the main stream of the plasma gas which forms an open end of the anode in the flow direction of the main stream, and at least one inlet for receiving the $C_1$- to $C_4$-alkane-containing plasma gas introduced into the plasma section of the reactor via the at least one first feed line, wherein the at least one inlet forms an open end of the anode facing into the direction opposite to the flow direction of the main stream, and wherein the anode is configured such that the plasma gas flows through the hollow channel via the open end of the anode facing into the direction opposite to the flow direction of the main stream and the open end of the anode in the flow direction of the main stream, wherein the plasma gas contacts the inner surface of the hollow channel of the anode during passage through the anode, and
wherein said anode and said cathode are arranged so that the arc generated by said anode and cathode is formed in said plasma section to form a plasmaeous plasma gas in said plasma section from the $C_1$- to $C_4$-alkane-containing plasma gas introduced into said plasma section through said at least one first feed line, and wherein foot points of the electric arc contacting the anode are located on the inner surface of the hollow channel of the anode, and
ii) a second reactor section directly downstream of the plasma section of the reactor in the flow direction of the main stream, the second reactor section comprising
a first subsection and a second subsection, wherein the second subsection is directly downstream of the first subsection in the flow direction of the main stream, and
outlet means for withdrawing components from the reactor, wherein the outlet means are located at the end of the second reactor section in the flow direction of the main stream, wherein
the first subsection comprises at least one second feed line for introducing a $C_1$- to $C_4$-alkane-containing gas into the second reactor section, wherein
the at least one second feed line is arranged such that the $C_1$- to $C_4$-alkane-containing gas which is introduced into the reactor via the at least one second feed line is introduced into the plasmaeous plasma gas at a position downstream of the foot points of the electric arc in the flow direction of the main stream, so that in the first subsection of the second reactor section downstream of the at least one second feed line a mixture is formed from the plasmaeous plasma gas leaving the plasma section and the $C_1$- to $C_4$-alkane-containing gas of the at least one second feed line, and
wherein the position of the at least one second feed line along the flow direction of the main stream defines a beginning of the second reactor section and of its first subsection, and
wherein the plasma section has a volume which begins at the most upstream position at which the inner surface of the hollow channel of the anode is facing the electric arc and reaches down to the end of the plasma section of the reactor,
wherein the plasma section volume is in the range of 0.0001 m$^3$ to 0.4 m$^3$, and defines a reference volume, and wherein the first subsection of the second reactor section has a volume in the range of 10 to 200 times the reference volume, and wherein the total second reactor section has a volume in the range of 20 to 2000 times the reference volume, and wherein the reactor comprises in the first subsection of the second reactor section and/or in the plasma section in the range downstream in the flow direction of the main stream of the foot points of the electric arc on the inner surface of the hollow channel of the anode down to the end of the plasma section at least at one point a flow cross-section transverse to the flow direction of the main stream which is greater by at least a factor of 5, in comparison with the average flow cross-section of the anode transverse to the flow direction of the main stream in the range of the foot points of the electric arc on the inner surface of the hollow channel of the anode.

* * * * *